(12) United States Patent
Toba

(10) Patent No.: US 9,028,275 B2
(45) Date of Patent: May 12, 2015

(54) ELECTRONIC APPARATUS, CATEGORY DETERMINATION METHOD FOR TRANSMISSION CABLE AND TRANSMISSION CABLE

(75) Inventor: Kazuaki Toba, Kanagawa (JP)

(73) Assignee: Sony Corporation, Tokyo (JP)

( * ) Notice: Subject to any disclaimer, the term of this patent is extended or adjusted under 35 U.S.C. 154(b) by 98 days.

(21) Appl. No.: 13/538,382

(22) Filed: Jun. 29, 2012

(65) Prior Publication Data

US 2013/0002289 A1    Jan. 3, 2013

Related U.S. Application Data

(60) Provisional application No. 61/504,010, filed on Jul. 1, 2011.

(51) Int. Cl.
  *G01R 19/00* (2006.01)
  *H01R 29/00* (2006.01)
  *G01R 31/02* (2006.01)

(52) U.S. Cl.
  CPC ............. *H01R 29/00* (2013.01); *G01R 31/021* (2013.01)

(58) Field of Classification Search
  CPC ... H04N 21/43635; H04N 7/10; G01R 31/021
  USPC ......... 326/21, 86; 327/63; 439/578, 608, 610, 439/490
  See application file for complete search history.

(56) References Cited

U.S. PATENT DOCUMENTS

| | | | |
|---|---|---|---|
| 7,033,213 B2* | 4/2006 | Dove | 439/578 |
| 8,185,669 B2* | 5/2012 | Oh | 710/8 |
| 8,243,204 B2* | 8/2012 | Nakajima et al. | 348/723 |
| 8,251,740 B2* | 8/2012 | Grice et al. | 439/490 |
| 8,479,236 B2* | 7/2013 | Tao | 725/80 |
| 8,479,248 B2* | 7/2013 | Horan et al. | 725/127 |
| 8,502,070 B2* | 8/2013 | Horan et al. | 174/36 |
| 8,502,073 B2* | 8/2013 | Horan et al. | 174/74 R |
| 2005/0258856 A1 | 11/2005 | Kishimoto et al. | |
| 2008/0104660 A1* | 5/2008 | Oh | 725/151 |
| 2010/0289530 A1 | 11/2010 | Nakajima et al. | |
| 2011/0043707 A1 | 2/2011 | Umezu | |

FOREIGN PATENT DOCUMENTS

| | | |
|---|---|---|
| JP | 62-75653 U | 5/1987 |
| WO | WO 2008/056719 A1 | 5/2008 |
| WO | WO 2009/118851 A1 | 10/2009 |
| WO | WO 2010/119308 A2 | 10/2010 |

OTHER PUBLICATIONS

International Search Report Issued Jul. 24, 2012 in PCT/JP2012/065791 (with English translation).

(Continued)

*Primary Examiner* — Vibol Tan
(74) *Attorney, Agent, or Firm* — Oblon, McClelland, Maier & Neustadt, L.L.P.

(57) ABSTRACT

An electronic apparatus includes: a receptacle having a plurality of pins for connecting a plug of a transmission cable; and a transmission cable determination section adapted to apply a predetermined voltage to a predetermined one of the pins of the receptacle to determine a category of the transmission cable.

13 Claims, 24 Drawing Sheets

(56) References Cited

OTHER PUBLICATIONS

"High-Definition Multimedia Interface Specification", HDMI Licensing, LLC, Version 1.4, Jun. 5, 2009, 425 pages.

Search Report issued Feb. 18, 2015 in European Patent Application No. 12806974.7.

* cited by examiner

FIG. 6A / FIG. 6B

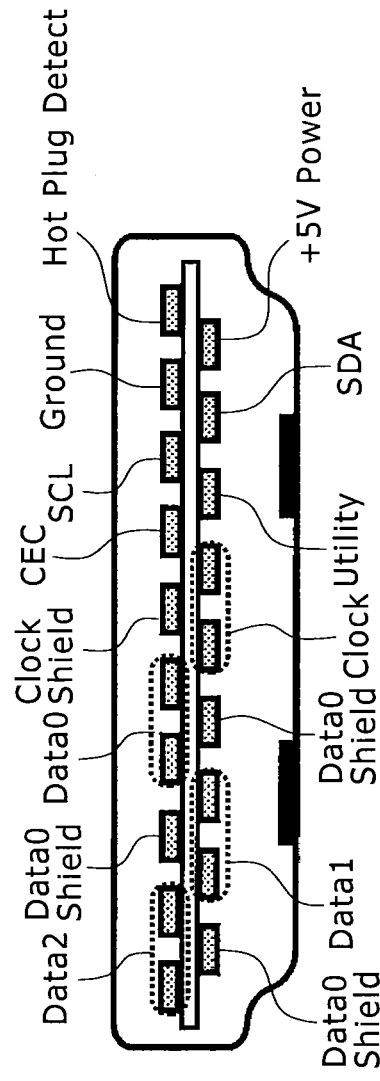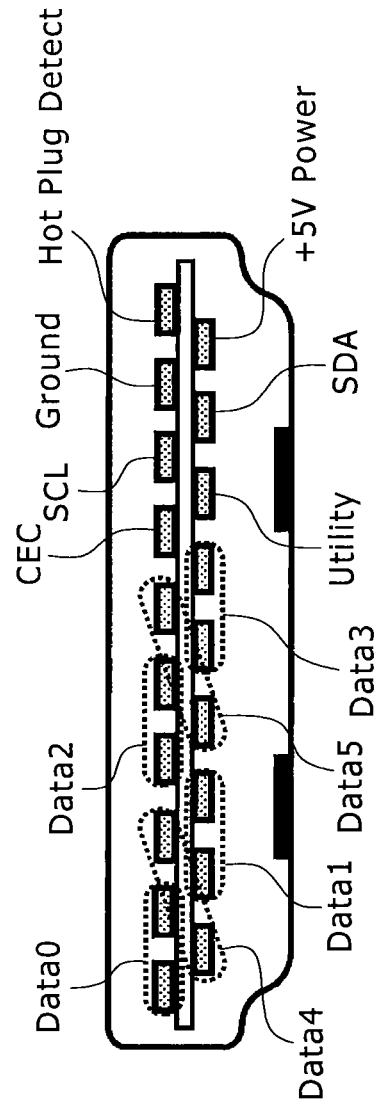
FIG. 7A
FIG. 7B

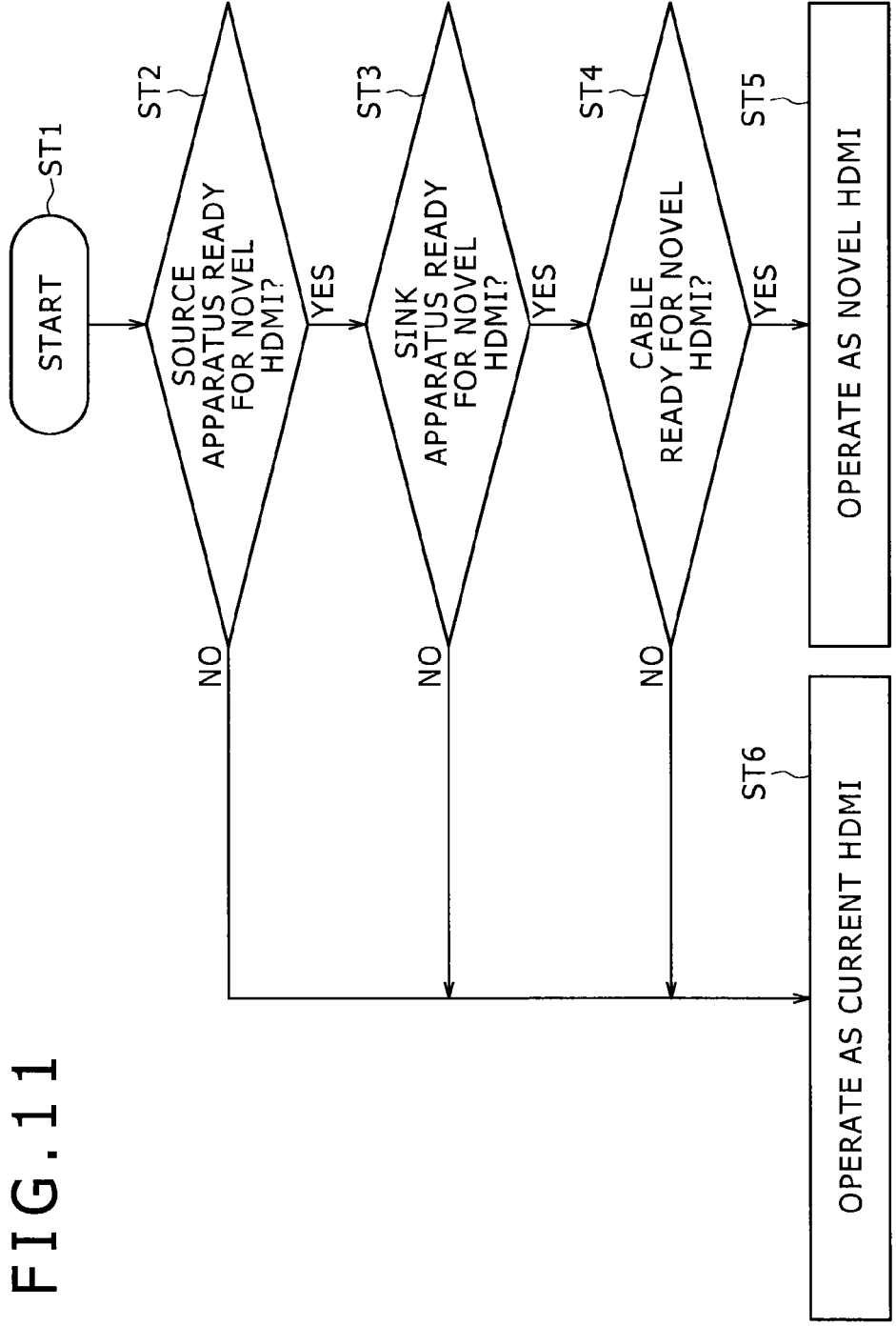

FIG.12A

[Display shows: CONNECTED BY NOVEL HDMI] — DISPLAY SECTION

FIG.12B

[Display shows: CONNECTED BY NOVEL HDMI | CONNECTED BY CONVENTIONAL HDMI] — DISPLAY SECTION

FIG.12C

[Display shows: THE CONNECTION CABLE IS OF THE CONVENTIONAL HDMI TYPE. THE FUNCTION OF THE NOVEL HDMI WILL BE PARTLY LIMITED.] — DISPLAY SECTION

FIG.14

| Byte # | 7 | 6 | 5 | 4 | 3 | 2 | 1 | 0 |
|---|---|---|---|---|---|---|---|---|
| | Rsvd (0) | Rsvd (0) | Rsvd (0) | Rsvd (0) | Rsvd (0) | New Rx Sink | Rsvd (0) | Rsvd (0) |

FIG. 21

| CATEGORY | FREQUENCY BAND/LANE | STRUCTURE | POWER SUPPLY CAPACITY | EQUALIZER | RESISTANCE VALUE | MEASUREMENT VALUE | APPLICATION |
|---|---|---|---|---|---|---|---|
| 1 | 3Gbps | 6lane+Cont | 0.5A | NO | 50Ω | 100mA | NORMAL |
| 2 | 3Gbps | 3lane+Cont | 2A | NO | 100Ω | 50mA | FOR MOBILE |
| 3 | 3Gbps | 6lane+Cont | 0.5A | YES | 500Ω | 10mA | LONG DISTANCE |
| 4 | 6Gbps | 6lane+Cont | 2A | YES | 5kΩ | 1mA | WIDE BAND |

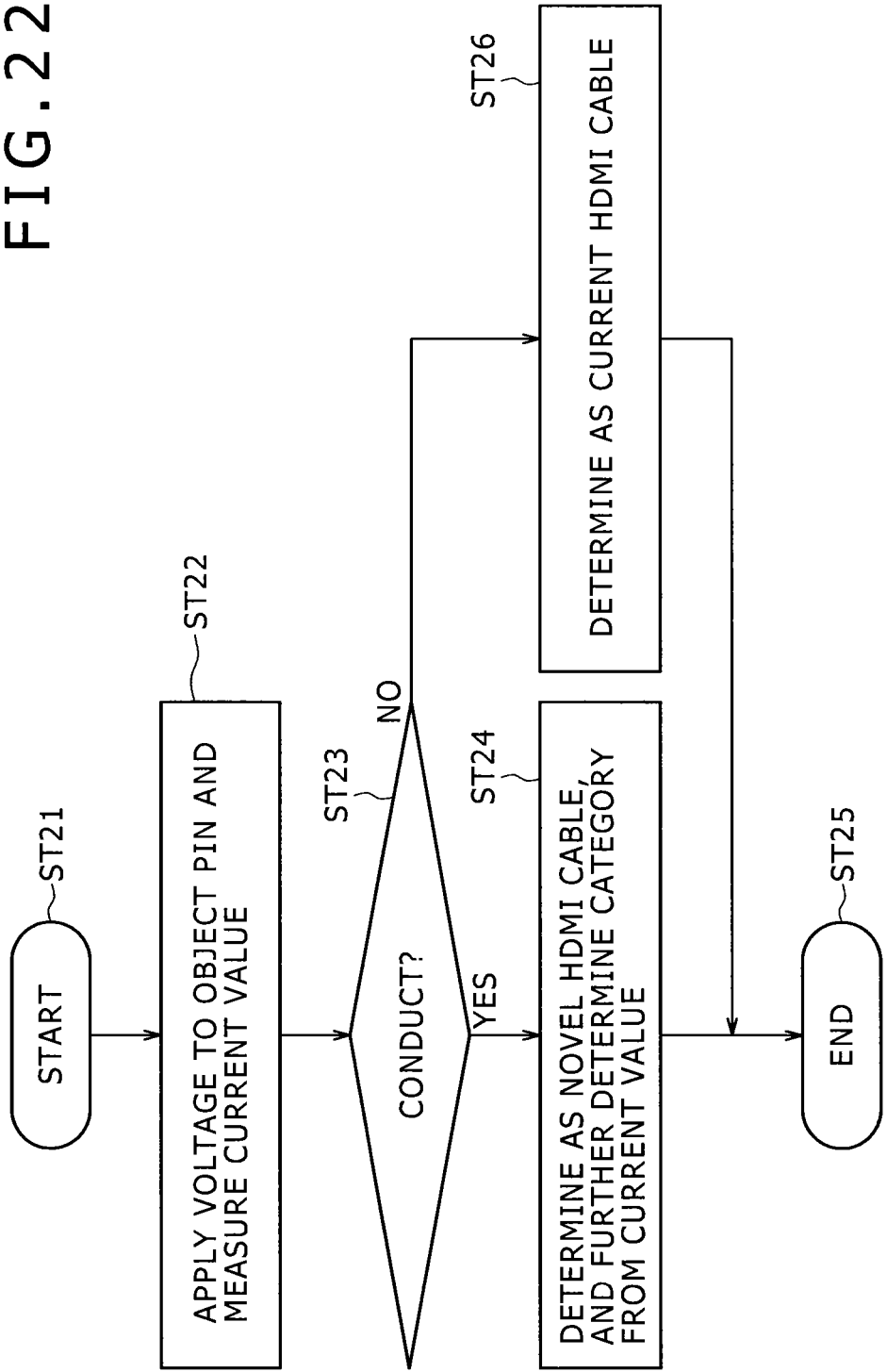

ELECTRONIC APPARATUS, CATEGORY DETERMINATION METHOD FOR TRANSMISSION CABLE AND TRANSMISSION CABLE

CROSS-REFERENCE TO RELATED APPLICATION

This application claims the benefit of priority of Provisional Application Ser. No. 61/504,010, filed Jul. 1, 2011, the entire contents of which is incorporated herein by reference.

BACKGROUND

The present technology relates to an electronic apparatus, a category determination method for a transmission cable, and a transmission cable. The present technology relates particularly to an electronic apparatus and so forth wherein a transmission cable is used to transmit a digital signal.

In recent years, HDMI (High Definition Multimedia Interface) is used widely as a digital interface for interconnecting CE (Consumer Electronics) apparatus and has become a de facto standard in the business world. For example, in "High-Definition Multimedia Interface Specification Version 1.4, Jun. 5, 2009," the HDMI standards are described. In this HDMI standards, 3 data differential line pairs (TMDS Channel 0/1/2) are used to carry out transmission of video, audio and control signals as digital signals.

SUMMARY

At present, the value prescribed as the transmission speed of the digital signal on the HDMI standards is approximately 10.2 Gbps in the maximum. If it is intended to establish compatibility with a high quality 3D (3 dimension) video signal or a 4k2k (QFHD) video signal or a video signal of higher picture quality contents in the future, then it is expected that expansion of HDMI to a transmission speed higher than the highest transmission speed on the standards at present such as 15 Gbps or 20 Gbps is demanded in the future.

Two approaches seem available for increase of the transmission speed of HDMI. One of the approaches is a method of using 3 data differential line pairs at present as they are while the clock speed for transmission of data is raised thereby to raise the transmission rate that much. However, with this method, it is difficult to expand the transmission band only by increase of the clock speed from a physical limitation by use of differential pairs of copper lines. Further, even if this method is applicable, it is supposed that the transmission distance becomes very short. In other words, the approach has a problem in that the length of the HDMI cable for interconnecting different apparatus is limited.

The other approach as means for solving which relates to the present technology is to increase the number of data differential line pairs, which is three at present, to four or more. In response to the increase, the date rate can be increased by an amount by which the lanes for transmitting data increase. However, this method of increasing the number of data differential line pairs provides a problem in compatibility with the existing HDMI. In particular, for example, if the number of pins of a connector, which is 19 at present, is increased by a number equal to that of the differential line pairs, then the connector lacks in compatibility in connection to apparatus in the past. This will unfavorably mislead and confuse the user.

Means for solving this is to maintain the compatibility of connectors (plugs, receptacles). In short, it is necessary to devise wiring such that a cable itself remains free from a functional failure without changing connectors from those in the past which have 19 pins.

It is desirable to determine a category of a transmission cable readily at a low cost. Also, it is desirable to satisfactorily carry out transmission of a digital signal using a transmission cable between electronic apparatus. Further, it is desirable to satisfactorily carry out transmission of a digital signal between electronic apparatus which have functions of the current HDMI and a novel digital interface (novel HDMI) which has high compatibility with the current HDMI but allows signal transmission at a date rate higher than that of the current HDMI.

The concept of the present technology resides in
an electronic apparatus, including:
a receptacle having a plurality of pins for connecting a plug of a transmission cable; and
a transmission cable determination section adapted to apply a predetermined voltage to a predetermined one of the pins of the receptacle to determine a category of the transmission cable.

In the present technology, the category of the transmission cable connected to the receptacle by the plug is determined. This determination of the category of the transmission cable is carried out by applying the predetermined voltage to the predetermined pin of the receptacle. For example, in the plug of the transmission cable, a plurality of pins are disposed on the inner side of a shield shell with an insulator interposed therebetween.

For example, in response to the category of the transmission cable, a resistor is connected or is not connected between a predetermined pin and the shield shell of the plug. Further, for example, in response to the category of the transmission cable, the resistance value of the resistor connected between the predetermined pin and the shield shell of the plug is made different. Here, the predetermined pin of the plug is a pin connected to the predetermined pin of the receptacle described above when the plug is connected to the receptacle.

In the present technology, for example, the determination of the category of the transmission cable is carried out based on whether or not current flows through the predetermined pin when the predetermined voltage is applied to the predetermined pin of the receptacle. Or, in the present technology, for example, the determination of the category of the transmission cable is carried out based on the magnitude of current flowing through the predetermined pin when the predetermined voltage is applied to the predetermined pin of the receptacle.

Here, the category of the transmission cable indicates, for example, a difference in physical structure of the transmission cable, a difference in compensated transmission band of the transmission cable, a difference in value of current which can be supplied through the transmission cable, a difference in presence/absence of an equalizer in the transmission cable, or the like.

In the present technology, for example, the transmission cable determination section may determine the category of the transmission cable by successively applying the predetermined voltage to a plurality of pins as the predetermined pin of the receptacle. By configuring the electronic apparatus such that the category of the transmission cable is determined by successively applying the predetermined voltage to the plural pins in this manner, three or more categories of the transmission cables can be determined only by a digital decision of whether or not current flows without deciding the current value.

In the present technology, the electronic apparatus may be configured such that the transmission cable transmits a digital signal in the form of differential signals, and the transmission cable determination section applies the predetermined voltage to the predetermined pin of the receptacle to determine which one of a first category and a second category which use different numbers of channels of differential signals from each other the category of the transmission cable is.

Further, in the present technology, the electronic apparatus may further include a digital signal transmission section adapted to transmit a digital signal to an external apparatus through the transmission cable, and an operation controlling section adapted to control operation of the digital signal transmission section based on a result of the determination of the transmission cable determination section.

In this instance, the electronic apparatus is configured such that the digital signal transmission section has a first operation mode and a second operation mode in which the digital signal transmission section transmits a digital signal in the form of differential signals to the external apparatus through a transmission line such that the number of channels of the differential signals in the first operation mode is a first number and the number of channels of the differential signals in the second operation mode is a second number which is greater than the first number, and the transmission cable determination section applies the predetermined voltage to the predetermined pin of the receptacle to determine whether the category of the transmission cable is a first category which is ready for the first operation mode and a second category which is ready for the second operation mode.

In this manner, in the present technology, the category of the transmission cable can be determined by applying the predetermined voltage to the predetermined pin of the receptacle. In other words, the category of the transmission cable can be determined readily at a low cost. Further, in the present technology, transmission of a digital signal using the transmission cable between transmission apparatus can be carried out favorably.

Meanwhile, another concept of the present technology resides in a transmission cable, including:

a plug having a plurality of pins disposed on the inner side of a shield shell with an insulating member interposed therebetween for connecting to a receptacle of an electronic apparatus;

a resistor being connected between a predetermined one of the pins and the shield shell of the plug.

In the present technology, the resistor is connected between the predetermined pin and the shield shell of the plug. Therefore, in an electronic apparatus to which this transmission cable is connected, when a predetermined voltage is applied to a predetermined pin of a receptacle to which the predetermined pin of the plug is connected, current flows through the predetermined pin. From this, the category of the transmission cable can be determined.

It is to be noted that, in the present technology, for example, the resistance value of the resistor may be a value corresponding to a category of the transmission cable. By this, in an electronic apparatus to which this transmission cable is connected, a finer category of the transmission cable can be determined from the magnitude of current flowing through the predetermined pin of the receptacle to which the predetermined pin of the plug is connected when the predetermined voltage is applied to the predetermined pin of the receptacle.

With the present technology, the category of a transmission cable can be determined readily at a low cost. Further, with the present technology, transmission of a digital signal using a transmission cable between transmission apparatus can be carried out favorably.

BRIEF DESCRIPTION OF THE DRAWINGS

FIGS. 6A and 6B are views illustrating pin assignments of the current HDMI (Type A) and the novel HDMI for comparison;

FIGS. 7A and 7B are views showing pin arrangement of receptacles of a source apparatus and a sink apparatus of the current HDMI and the novel HDMI;

FIG. 11 is a flow chart illustrating an example of a processing procedure for operation mode control of a control section of the source apparatus;

FIG. 12 is views showing an example of UI screen images displayed on a display section (display) under the control of a control section of the source apparatus;

FIG. 14 is a view illustrating an example of flag information newly defined on EDID;

FIG. 21 is a view illustrating an example of categories of transmission cables categorized taking a compensated transmission band, a physical structure, feed power, presence/absence of an equalizer and so forth into consideration;

FIG. 22 is a flow chart illustrating another example of the processing procedure for category determination of a cable by the control section of the source apparatus;

DETAILED DESCRIPTION OF THE PREFERRED EMBODIMENT

In the following, a mode for carrying out the technology (hereinafter referred to as "embodiment") is described. It is to be noted that the description is given in the following order.
1. Embodiment
2. Modifications

1. Embodiment

Example of the Configuration of the AV System

Figure 1:
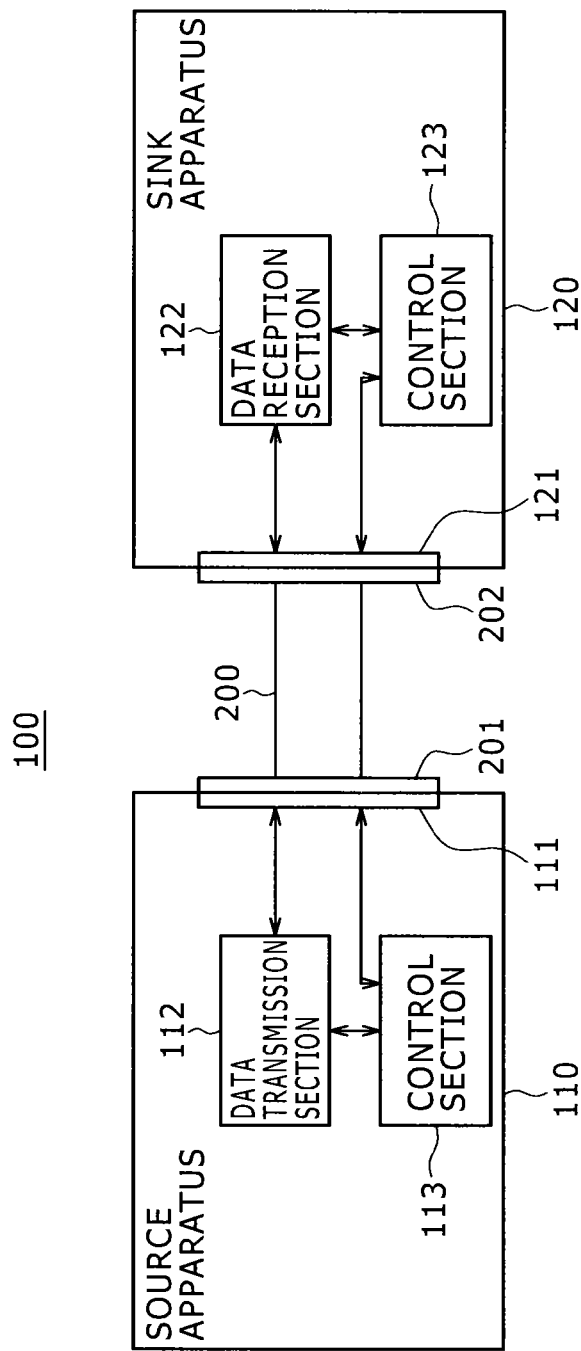
FIG. 1 is a block diagram showing an example of a configuration of an AV system as an embodiment of the present technology.

FIG. 1 shows an example of a configuration of an AV (Audio and Visual) system 100 as an embodiment. This AV system 100 is configured from a source apparatus 110 and a sink apparatus 120 connected to each other. The source apparatus 110 is an AV source such as, for example, a game machine, a disk player, a set top box, a digital camera, a portable telephone set or the like. The sink apparatus 120 is, for example, a television receiver, a projector or the like.

The source apparatus 110 and the sink apparatus 120 are connected to each other through a transmission cable (hereinafter referred to simply as cable) 200. A receptacle 111 to which a data transmission section 112 is connected and which configures a connector is provided on the source apparatus 110. Another receptacle 121 to which a data reception section 122 is connected and which configures another connector is provided on the sink apparatus 120.

Further, a plug 201 which configures the connector is provided at one end of the cable 200, and a plug 202 which configures the connector is provided at the other end of the cable 200. The plug 201 at the one end of the cable 200 is connected to the receptacle 111 of the source apparatus 110, and the plug 202 at the other end of the cable 200 is connected to the receptacle 121 of the sink apparatus 120.

The source apparatus 110 has a control section 113. The control section 113 controls the entire source apparatus 110. In this embodiment, the data transmission section 112 of the source apparatus 110 is ready for both of the current HDMI and the novel HDMI. In the case where the control section 113 decides that the cable 200 is ready for the novel HDMI and besides the sink apparatus 120 is ready for the novel HDMI, it controls the data transmission section 112 to operate in the operation mode of the novel HDMI. On the other hand, in the case where the control section 113 decides at least that the sink apparatus 120 is ready only for the current HDMI, or in the case where the control section 113 decides that the cable 200 is ready for the current HDMI, it controls the data transmission section 112 to operate in the operation mode of the current HDMI.

The sink apparatus 120 has a control section 123. This control section 123 controls the entire sink apparatus 120. In this embodiment, the data reception section 122 of the sink apparatus 120 is ready only for the current HDMI or for both of the current HDMI and the novel HDMI. In the case where the data reception section 122 is ready for both of the current HDMI and the novel HDMI, the control section 123 controls the data reception section 122 to operate in an operation mode same as that of the data transmission section 112 of the source apparatus 110.

In this instance, the control section 123 controls the operation mode of the data reception section 122 based on a determination result of the operation mode sent thereto from the source apparatus 110 through a line such as a line for CEC (Consumer Electronics Control). The cable 200 is ready for the current HDMI or the novel HDMI. This cable 200 can carry out a determination regarding for which one of the current HDMI and the novel HDMI it is ready, that is, a category determination.

Figure 2:
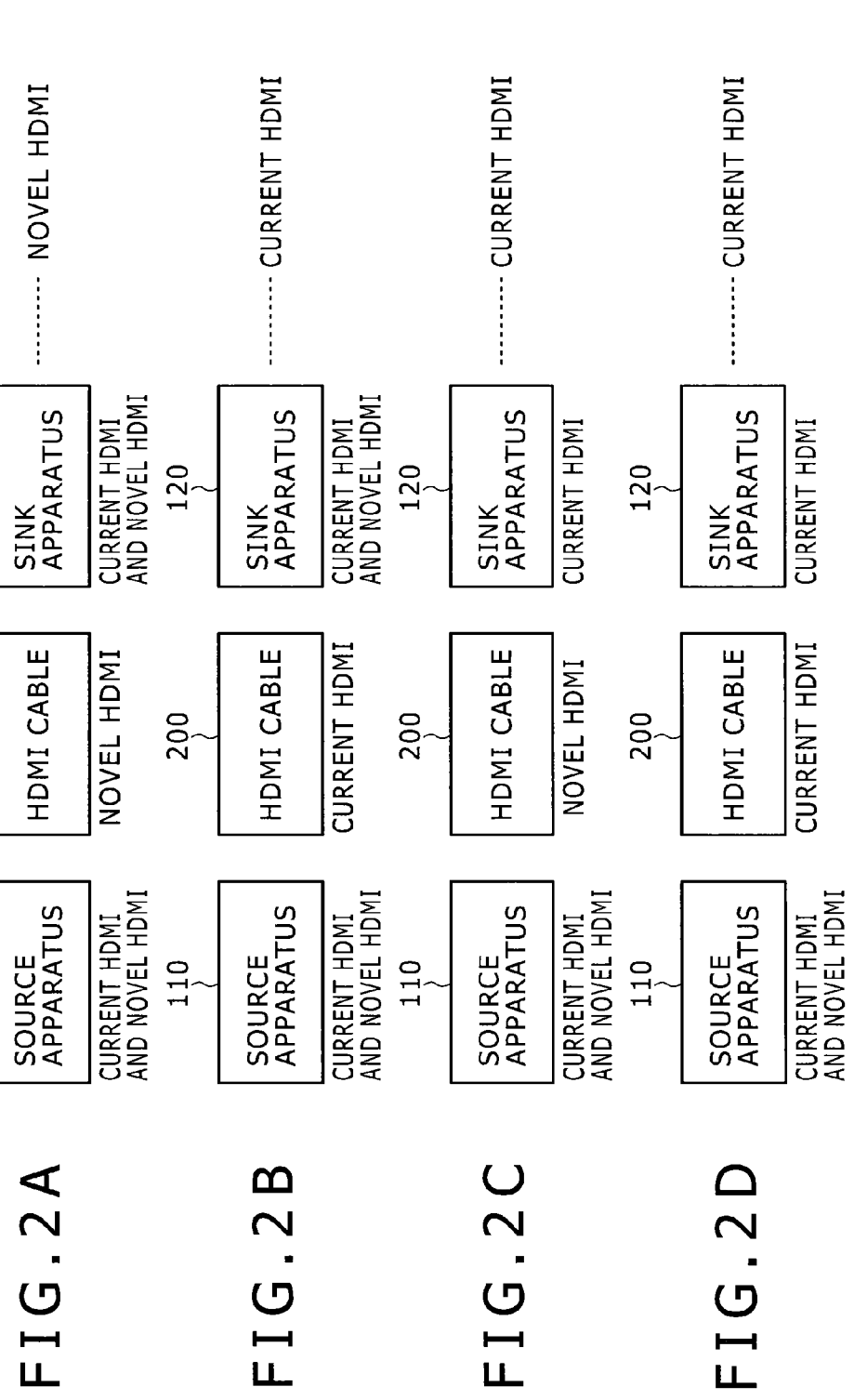
FIGS. 2A to 2D are views illustrating examples of combination of a source apparatus, a HDMI cable and a sink apparatus.

In the AV system 100 shown in FIG. 1, when the cable 200 is ready for the novel HDMI and the sink apparatus 120 is ready for both of the current HDMI and the novel HDMI as shown in FIG. 2A, data transmission by the novel HDMI is carried out. Thereupon, the data transmission section 112 of the source apparatus 110 and the data reception section 122 of the sink apparatus 120 are controlled so as to operate in the operation mode of the novel HDMI.

Further, in the AV system 100 shown in FIG. 1, when at least the cable 200 is ready for the current HDMI or the sink apparatus 120 is ready only for the current HDMI as shown in FIGS. 2B to 2D, data transmission by the current HDMI is carried out. Thereupon, the data transmission section 112 of the source apparatus 110 is controlled so as to operate in the operation mode of the current HDMI. Further, the data reception section 122 of the sink apparatus 120 which is ready for both of the current HDMI and the novel HDMI is controlled so as to operate in the operation mode of the current HDMI. It is to be noted that, in the case of FIG. 2B, when the cable 200 can carry out data transmission of the novel HDMI by lowering the data transfer rate or by a like means, data transmission in the novel HDMI mode is sometimes carried out.

[Example of the Configuration of the Data Transmission Section and the Data Reception Section]

Figure 3:
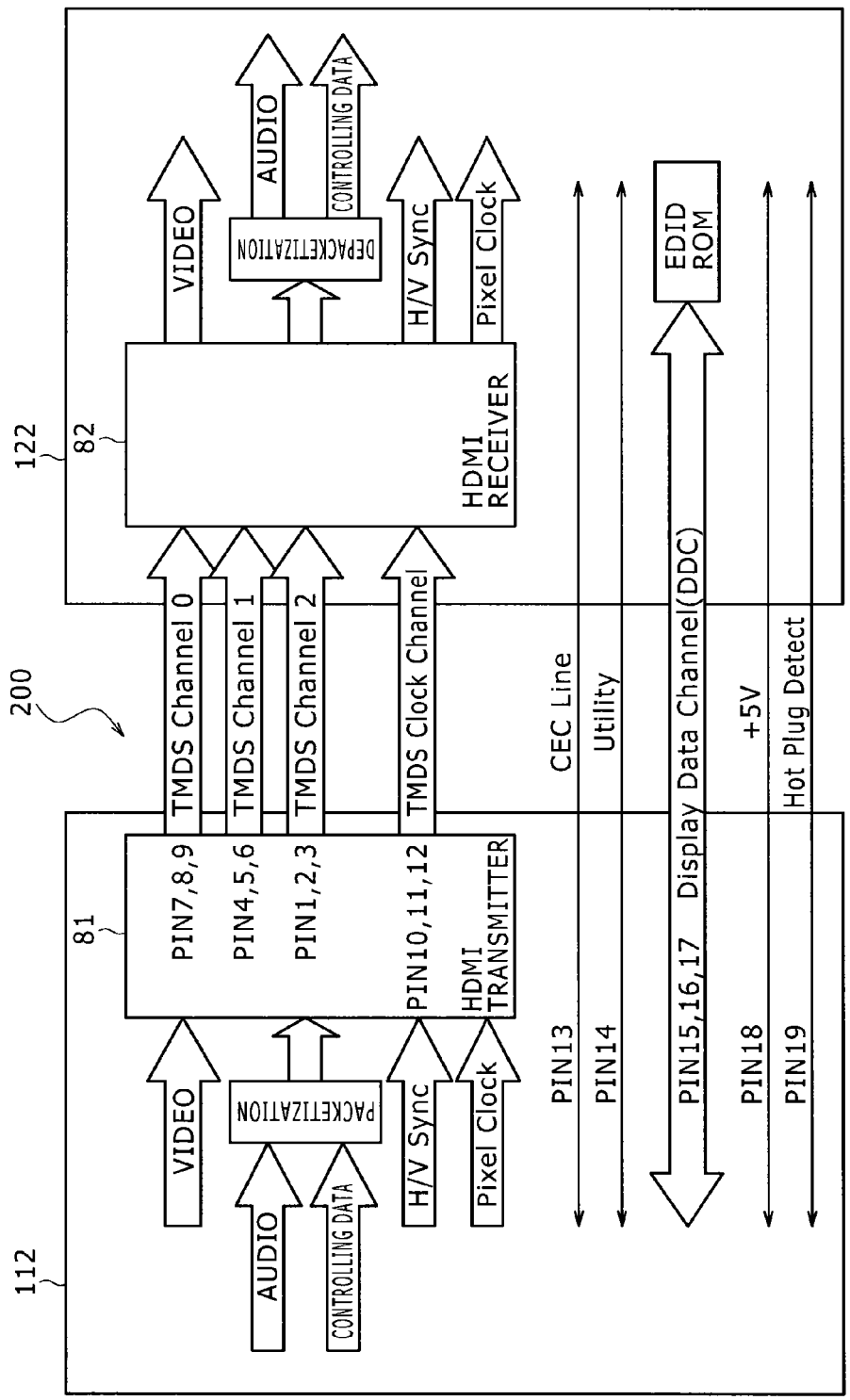
FIG. 3 is a view showing an example of a configuration of a data transmission section of the source apparatus and a data reception section of the sink apparatus (in a mode in which current HDMI operates)
Figure 4:
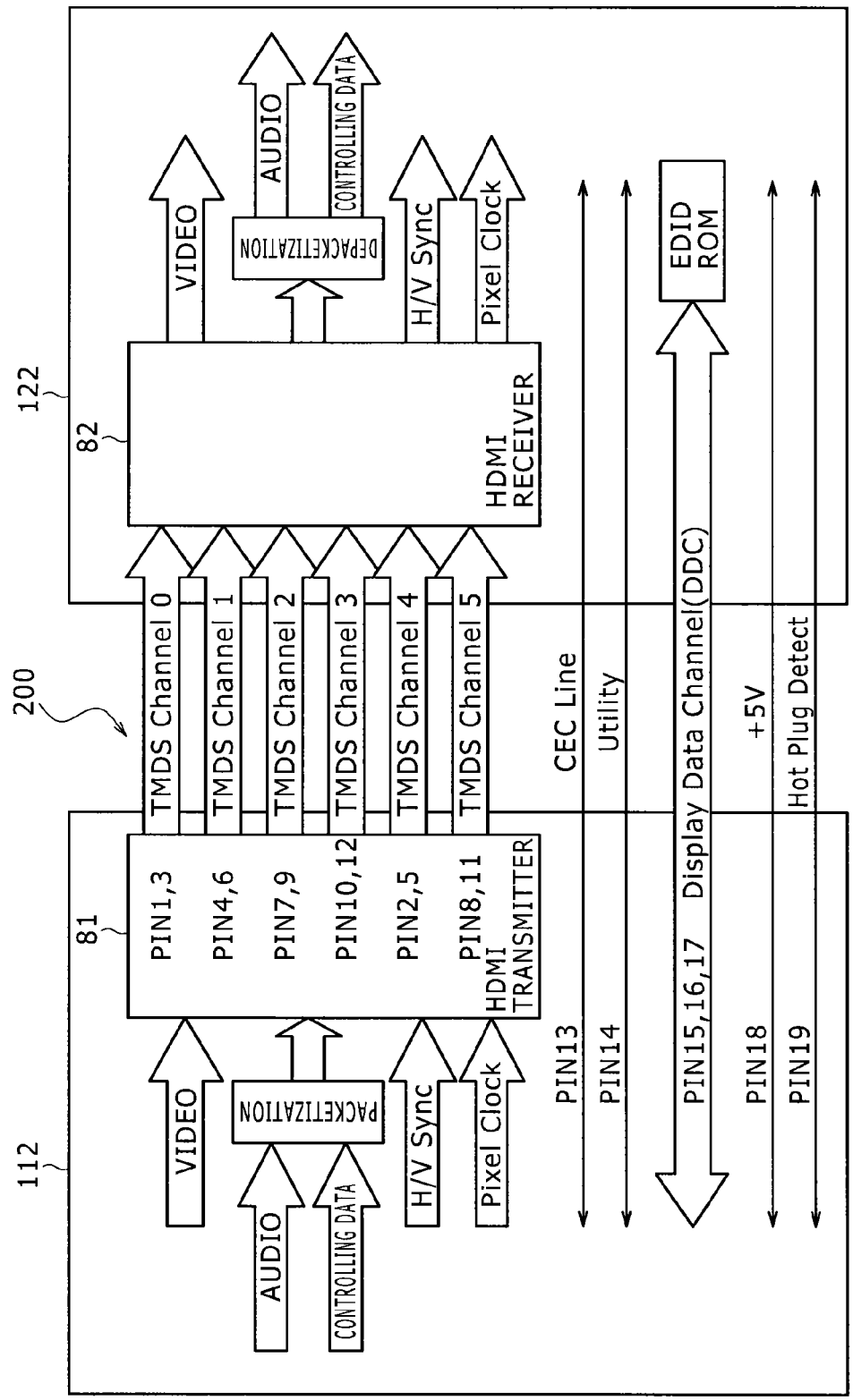
FIG. 4 is a view showing an example of a configuration of the data transmission section of the source apparatus and the data reception section of the sink apparatus (in another mode in which novel HDMI operates)

FIGS. 3 and 4 show an example of a configuration of the data transmission section 112 of the source apparatus 110 and the data reception section 122 of the sink apparatus 120 in the AV system 100 of FIG. 1. The data reception section 122 transmits, within a valid image period (also referred to as "active video period"), differential signals corresponding to non-compressed video data for one screen image in one direction to the data reception section 122 through a plurality of channels.

Here, the valid image period is a period when a horizontal blanking period and a vertical blanking period are removed from a period from one vertical synchronizing signal to a next vertical synchronizing signal. Further, the data transmission section 112 transmits, within a horizontal blanking period or a vertical blanking period, differential signals corresponding to at least audio data and control data associated with video data and other auxiliary data and so forth in one direction to the data reception section 122 through a plurality of channels.

The data reception section 122 receives differential signals corresponding to video data transmitted thereto in one direction from the data reception section 122 through a plurality of channels within an active video period. Further, the data reception section 122 receives differential signals corresponding to audio data and control data transmitted thereto in one direction from the data transmission section 112 through a plurality of channels within a horizontal blanking period or a vertical blanking period.

The following channels are available as transmission channels of the HDMI system formed from the data transmission section 112 and the data reception section 122. First, as transmission channels, differential signal channels (TMDS channels, TMDS clock channels) are available. While differential signal channels for transmitting a digital signal of video data or the like are, in the current HDMI, three channels, they are, in the novel HDMI, six channels.

Differential signal channels in the current HDMI are described. As shown in FIG. 3, as transmission channels for serially transmitting video data and audio data in one direction in synchronism with a pixel clock from the data transmission section 112 to the data reception section 122, three TMDS channels #0 to #2 are available. Further, as a transmission channel for transmitting a TMDS clock, a TMDS clock channel is available.

A HDMI transmitter 81 of the data transmission section 112 converts, for example, non-compressed video data into corresponding differential signals and serially transmits the differential signals in one direction to the data reception section 122 connected thereto through the cable 200 using the three TMDS channels #0, #1 and #2. Further, the HDMI transmitter 81 converts audio data associated with the non-compressed video data and necessary control data as well as other audio data and so forth into corresponding differential signals and serially transmits the differential signals in one direction to the data reception section 122 through the three TMDS channels #0, #1 and #2.

Further, the HDMI transmitter 81 transmits a TMDS clock synchronized with video data to be transmitted through the three TMDS channels #0, #1 and #2 to the data reception section 122 using the TMDS clock channel. Here, in one TMDS channel #i (i=0, 1, 2), video data of 10 bits is transmitted within a period of one clock of the TMDS clock.

A HDMI receiver 82 of the data reception section 122 receives differential signals corresponding to video data and differential signals corresponding to audio data and control data, transmitted thereto in one direction from the data transmission section 112 through the TMDS channels #0, #1 and #2. In this instance, the HDMI receiver 82 receives the differential signals in synchronism with a pixel clock (TMDS clock) transmitted thereto from the data transmission section 112 through the TMDS clock channel.

Now, differential signal channels in the novel HDMI are described. As shown in FIG. 4, six TMDS channels #0 to #5 are available as transmission channels for serially transmitting video data and audio data in one direction in synchronism with a pixel clock from the data transmission section 112 to the data reception section 122. It is to be noted that, in this novel HDMI, a self clock method is adopted wherein transmission of the TMDS clock is omitted and a clock is reproduced from reception data by the reception side.

The HDMI transmitter 81 of the data transmission section 112 converts, for example, non-compressed video data into corresponding differential signals and serially transmits the differential signals in one direction to the data reception section 122 connected thereto by the cable 200 using the six TMDS channels #0 to #5. Further, the HDMI transmitter 81 converts audio data associated with the non-compressed video data and necessary control data as well as other audio data and so forth into corresponding differential signals and serially transmits the differential signals in one direction to the data reception section 122 through the six TMDS channels #0 to #5.

The HDMI receiver 82 of the data reception section 122 receives differential signals corresponding to video data and differential signals corresponding to audio data and control data, transmitted thereto in one direction from the data transmission section 112 through the TMDS channels #0 to #5. In this instance, the HDMI receiver 82 reproduces a pixel clock from the reception data and receives the differential signals in synchronism with the pixel clock (TMDS clock).

The transmission channels of the HDMI system include, in addition to the TMDS channels and the TMDS clock channel described hereinabove, a transmission channel called DDC (Display Data Channel) or CEC line. The DDC is formed from two signal lines not shown included in the cable 200. The DDC is used by the data transmission section 112 to read out E-EDID (Enhanced Extended Display Identification Data) from the data reception section 122.

In particular, the data reception section 122 has, in addition to the HDMI receiver 82, an EDID ROM (EEPROM) which stores E-EDID which are capability information regarding the capability (Configuration/capability) of the data reception section 122 itself. The data transmission section 112 reads out the E-EDID from the data reception section 122, connected thereto through the cable 200, through the DDC, for example, in response to a request from the control section 113.

The data transmission section 112 sends the read out E-EDID to the control section 113. The control section 113 stores the E-EDID into a flash ROM or a DRAM not shown. The control section 113 can recognize setting of the capability of the data reception section 122 based on the E-EDID. For example, the control section 113 recognizes whether or not the sink apparatus 120 having the data reception section 122 is ready for the novel HDMI in addition to the current HDMI or the like. The CEC line is formed from one signal line not shown included in the cable 200 and is used to carry out bidirectional communication of controlling data between the data transmission section 112 and the data reception section 122.

Further, the cable 200 includes a line (HPD line) connected to a pin called HPD (Hot Plug Detect). The source apparatus can utilize this HPD line to detect connection of a sink apparatus thereto. It is to be noted that this HPD line is used also as a HEAC-line which configures a bidirectional communication line. Further, the cable 200 includes a power supply line (+5 V Power Supply Line) used to supply power from the source apparatus to the sink apparatus. Further, the cable 200 includes a utility line. This utility line is used also as a HEAC+ line which configures a bidirectional communication line.

Figure 5:
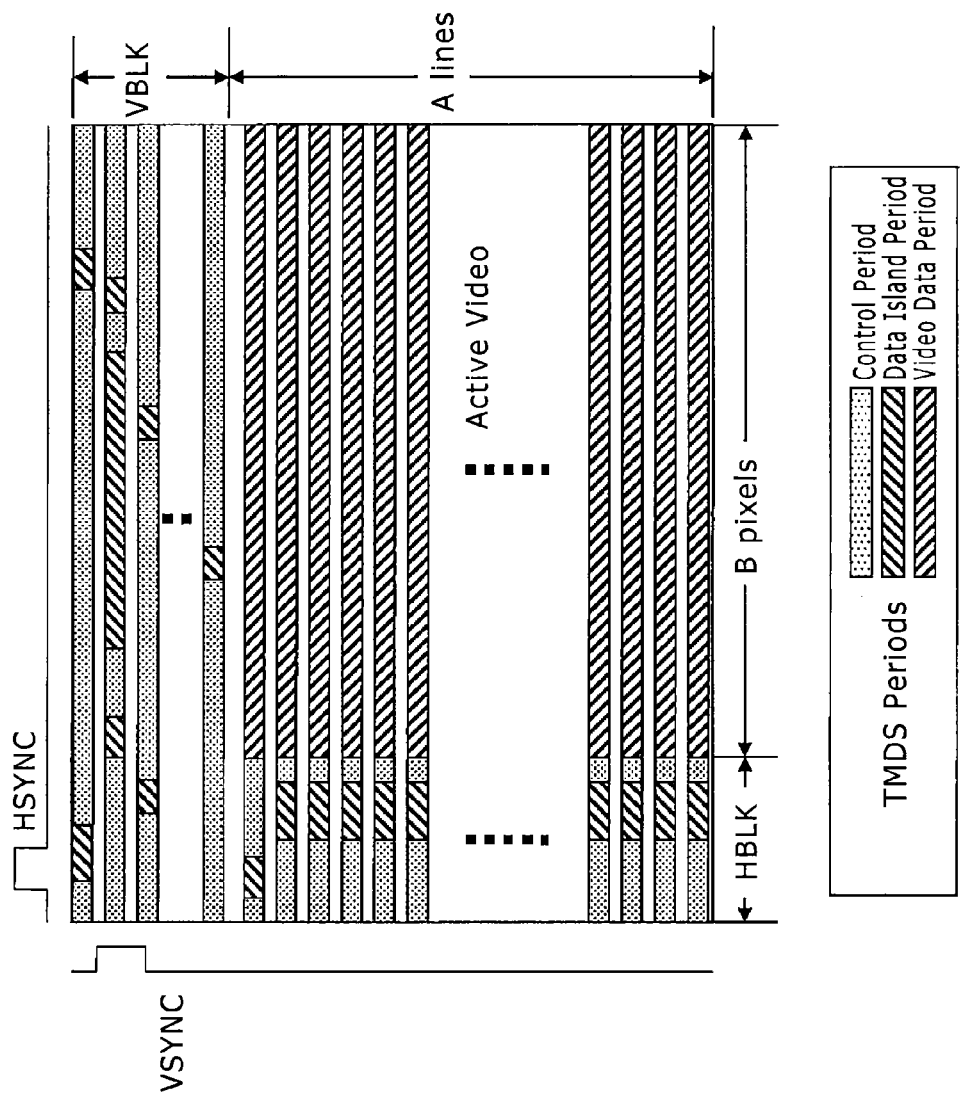
FIG. 5 is a view showing an example of a structure of TMDS transmission data.

FIG. 5 shows an example of the configuration of TMDS transmission data. This FIG. 5 shows periods of various transmission data in the case where image data for B pixels×A lines in the horizontal×vertical directions are transmitted through the TMDS channels #0 to #2 or the TMDS channels #0 to #5. A video field (Video Field) in which transmission data are transmitted through the TMDS channels of the HDMI includes three kinds of periods in response to the kinds of transmission data. The three kinds of periods are a video data period (Video Data period), a data island period (Data Island period) and a control period (Control Period).

Here, the video field period is a period from a rising edge (active edge) of a certain vertical synchronizing signal to a rising edge of a next vertical synchronizing signal. This video field period is divided into a horizontal blanking period (horizontal blanking), a vertical blanking period (vertical blanking), and an active video period (Active Video). To this active video period, a video data period which is a period when the horizontal blanking period and the vertical blanking period are removed from the video field period is allocated. Within this video data period, data of valid pixels (Active pixel) for B pixels (pixels)×A lines, which configure non-compressed image data for one screen image, are transmitted.

The data island period and the control period are allocated to the horizontal blanking period and the vertical blanking period. Within the data island period and the control period, auxiliary data (Auxiliary data) are transmitted. In particular, the data island period is allocated to part of the horizontal blanking period and the vertical blanking period. Within this data island period, data from among the auxiliary data which have no relation to control, for example, a packet of audio data or the like are transmitted. The control period is allocated to the other part of the horizontal blanking period and the vertical blanking period. Within this control period, data from within the auxiliary data which have a relation to control, for example, a vertical synchronizing signal and a horizontal synchronizing signal, a control packet and so forth are transmitted.

Here, the pin assignment of the receptacle 111 is described. First, the pin assignment (type A) of the current HDMI is described. The pin assignment of the current HDMI configures a first pin assignment. FIG. 6A illustrates this pin assignment of the current HDMI. TMDS Data#i+ and TMDS Data#i− which are differential signals of the TMDS channel #i (i=0 to 2) are transmitted by two lines which are differential lines. Pins (pins of the pin numbers 7, 4 and 1) are allocated to the TMDS Data#i+, and pins (pins of the pin numbers 9, 6 and 3) are allocated to the TMDS Data#i−. It is to be noted that pins having pin numbers 8, 5 and 2 are allocated to TMDS Data#i Shield (i=0 to 2).

TMDS Clock+ and TMDS Clock− which are differential signals of the TMDS clock channel are transmitted by two lines which are differential lines. A pin having a pin number 10 is allocated to the TMDS Clock+, and a pin having another pin number 12 is allocated to the TMDS Clock−. It is to be noted that a pin having a pin number 11 is allocated to TMDS Clock Shield.

Meanwhile, a CEC signal which is controlling data is transmitted by a CEC line. A pin having a pin number 13 is allocated to the CEC signal. Meanwhile, a SDA (Serial Data) signal of E-EDID or the like is transmitted by a SDA line. A pin having a pin number 16 is allocated to the SDA signal. Further, a SCL (Serial Clock) signal which is a clock signal used for synchronization upon transmission or reception of the SDA signal is transmitted by a SCL line. A pin having a pin number 15 is allocated to the SCL signal. It is to be noted that the DDC line described above is configured from the SDA line and the SCL line.

Meanwhile, a pin having a pin number 19 is allocated to a HPD/HEAC−. Further, a pin having a pin number 14 is allocated to a utility/HEAC+. Further, a pin having a pin number 17 is allocated to a DDC/CEC Ground/HEAC Shield. Further, a pin having a pin number 18 is allocated to a power supply (+5 V Power).

Now, a pin assignment of the novel HDMI is described. The pin assignment of this novel HDMI configures a second pin assignment. FIG. 6B illustrates this pin assignment of the novel HDMI. TMDS Data#i+ and TMDS Data#i− which are differential signals of the TMDS channel #i (i=0 to 5) are transmitted by two lines which are differential lines. Pins (pins having pin numbers 1, 4, 7, 10, 2 and 8) are allocated to TMDS Data#i+, and pins (pins having pin numbers 3, 6, 9, 12, 5 and 11) are allocated to TMDS Data#i−.

Further, the CEC signal which is controlling data is transmitted by the CEC line. A pin having a pin number 13 is allocated to the CEC signal. Meanwhile, the SDA (Serial Data) signal of E-EDID or the like is transmitted by the SDA line. A pin having a pin number 16 is allocated to the SDA signal. Further, the SCL (Serial Clock) signal which is a clock signal used for synchronization upon transmission or reception of the SDA signal is transmitted by the SCL line. A pin having a pin number 15 is allocated to the SCL signal. It is to be noted that the DDC line described above is configured from the SDA line and the SCL line.

Meanwhile, a pin having a pin number 19 is allocated to the HPD/HEAC−. Further, a pin having a pin number 14 is allocated to the utility/HEAC+. Further, a pin having a pin number 17 is allocated to the DDC/CEC Ground/HEAC Shield. Further, a pin having a pin number 18 is allocated to the power supply (+5 V Power).

As described hereinabove, in the novel HDMI pin assignment (refer to FIG. 6B), terminals (pins having pin numbers 2, 5, 8 and 11) used as shield terminals by the current HDMI pin assignment (refer to FIG. 6A) are used as data terminals. Further, in the novel HDMI pin assignment, those terminals (pins having pin numbers 10 and 12) which are used as signal terminals for differential signals of the clock signal in the current HDMI pin assignment are used as data terminals.

The data transmission section 112 of the source apparatus 110 selects, when it operates in the operation mode of the current HDMI, the current HDMI assignment illustrated in FIG. 6A, but selects, when it operates in the operation mode of the novel HDMI, the novel HDMI pin assignment illustrated in FIG. 6B. It is to be noted that, in the foregoing description, the pin assignment of the receptacle 111 of the source apparatus 110 is described. Although detailed description is omitted, the pin assignment of the receptacle 121 of the sink apparatus 120 in the case where the data reception section 122 of the sink apparatus 120 is ready for both of the current HDMI and the novel HDMI is similar to that described above.

FIGS. 7A and 7B illustrate pin arrangement of the receptacle 111 of the source apparatus 110. FIG. 7A illustrates the pin arrangement of the current HDMI, and FIG. 7B illustrates the pin arrangement of the novel HDMI. It is to be noted that, when the pin assignment of the current HDMI is selected as the pin assignment of the receptacle 111, pins having pin numbers 2, 5, 8 and 11 are placed into a grounded state in the source apparatus 110 and the sink apparatus 120.

Or, at this time, the pins having the pin numbers 2, 5, 8 and 11 are placed into a grounded state in the sink apparatus 120 and placed into a high impedance state in the source apparatus 110. Or, at this time, the pins are placed into a high impedance state in the sink apparatus 120 and placed into the grounded state in the source apparatus 110. It is to be noted that, while detailed description is omitted, the pin arrangement of the receptacle 121 of the sink apparatus 120 in the case where the data reception section 122 of the sink apparatus 120 is ready for both of the current HDMI and the novel HDMI is similar to that described above.

Figure 8B:
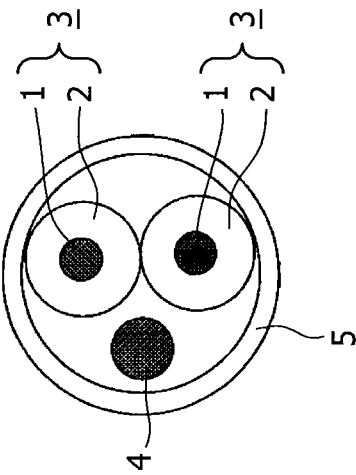
FIGS. 8A and 8B are views showing an example of a structure of a current HDMI cable.
Figure 8A:
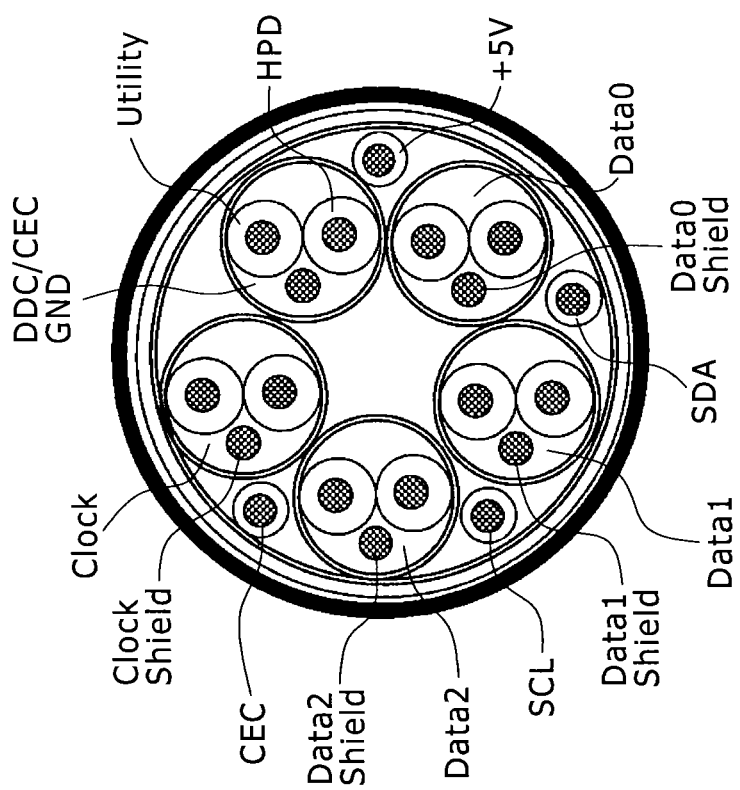

FIG. 8A shows an example of a structure of the current HDMI cable used as the cable 200. In this current HDMI cable, three data line pairs are individually configured as a shield twisted pair section in order that they have individual characteristics. Further, the clock line pair and also the utility and HPD line pair for the HEAC function are individually configured as a shield twisted pair section.

FIG. 8B shows an example of a structure of a shield twisted pair section. This shield twisted pair section is structured such that two electric wires 3 and a drain line 4 are covered with a shield member 5. It is to be noted that the electric wires 3 are configured such that a core 1 is covered with a covering member 2.

In the current HDMI cable, the drain line which configures each shield twisted pair section for data and a clock is connected to a pin of a plug attached to an end portion of the cable. In this instance, each drain line is connected to a pin (terminal) corresponding to each shield terminal (pin for shielding having a pin number 2, 5, 8 or 11) of the above-described receptacle (pin arrangement of the current HDMI). The drain line which configures each shield twisted pair section for data and a clock is placed in a grounded state in a state thereof in which the plug is connected to the receptacle (pin arrangement of the current HDMI).

Figure 9:
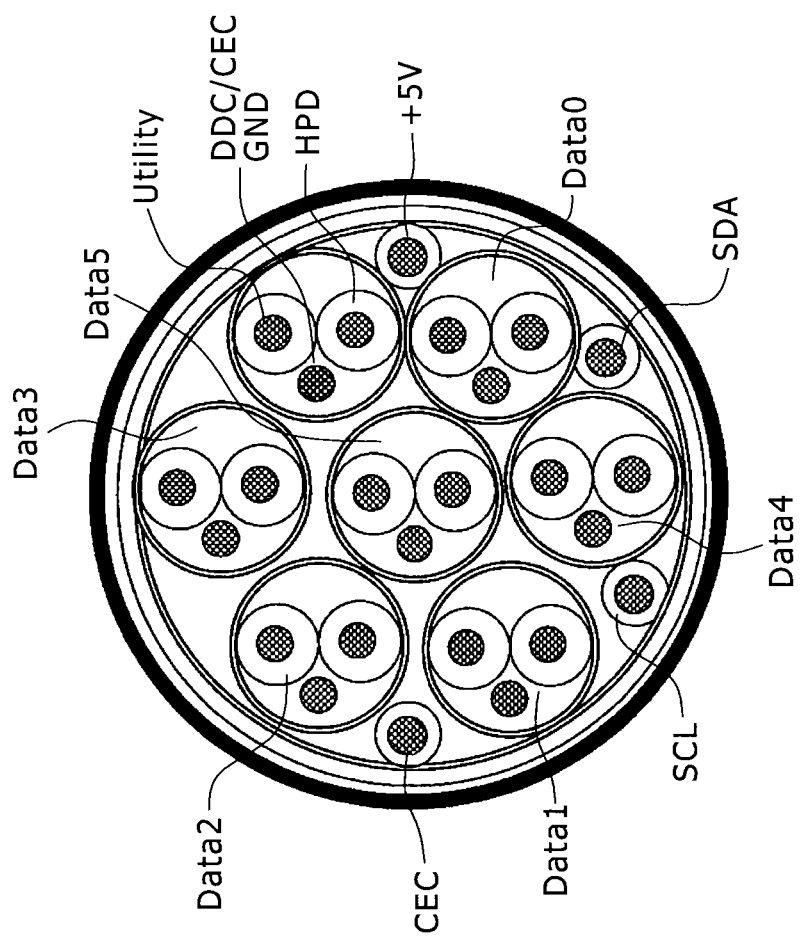
FIG. 9 is a view showing an example of a structure of the novel HDMI cable.

FIG. 9 shows an example of a structure of the novel HDMI cable used as the cable 200. In this novel HDMI cable, each of six data line pairs is configured as a shield twisted pair section in order that it may obtain a characteristic. Further, for the HEAC function, also a utility and HPD line pair is configured as a shield twisted pair section.

The novel HDMI cable includes an increased number of copper wires to be connected individually in comparison with the current HDMI (refer to FIG. 8A). In this novel HDMI cable, the drain line which configures each shield twisted pair section connected by pins for exclusive use of plugs at the opposite ends of the cable is connected to a shell (shield shell) made of a metal of the plugs. Consequently, the pin for the shield is released, and increase of the number of necessary pins of each plug is prevented. Thus, the plugs of the novel HDMI cable are similar to those of the plugs of the current HDMI cable.

In this manner, in the case where the drain line which configures each shield twisted pair section is connected to a shell made of a metal of a plug, since the shell of a receptacle into which the plug is to be inserted is connected to the ground level, the shield of the differential pair lines can be assured. Further, in this instance, the shells, made of a metal, of the plugs at the opposite ends of the cable 200 are placed into a state in which they are short-circuited (shorted) by the drain line. Consequently, the ground levels at the opposite ends of the cable are shared and have an equal level. Consequently, the transmission capacity, noise resisting property and so forth of the cable 200 can be improved.

Figure 10:
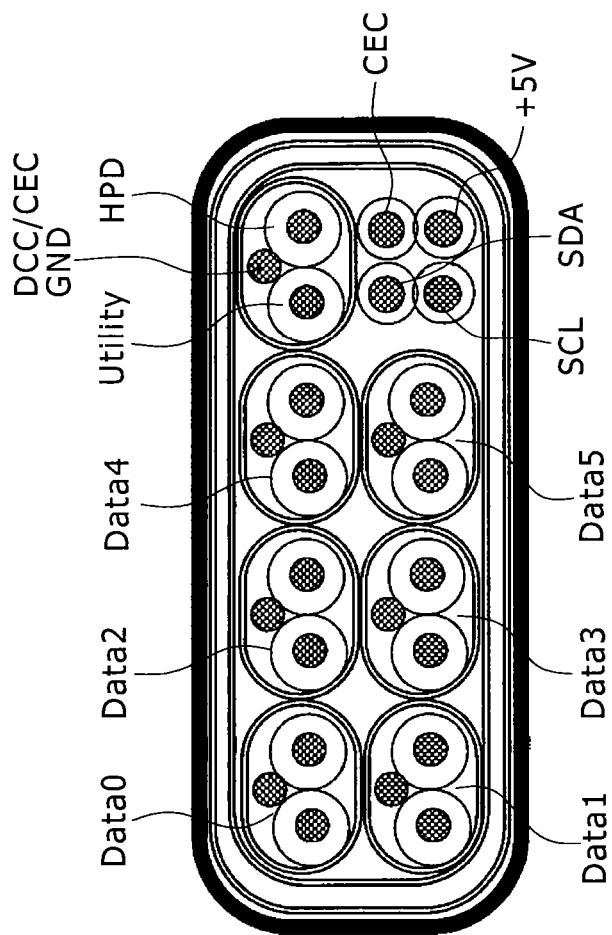
FIG. 10 is a view showing another example of a structure of the novel HDMI cable.

FIG. 10 shows another example of a configuration of the novel HDMI cable used as the cable 200. This novel HDMI cable has a substantial structure similar to that of the novel HDMI cable described hereinabove with reference to FIG. 9 except that the sectional shape thereof is flattened. It is to be noted that it is known that, by flattening the sectional shape in this manner, the sectional area can be reduced and it becomes easy to establish impedance matching.

[Operation Mode Control of the Current HDMI and the Novel HDMI]

Now, operation mode control of the control section 113 of the source apparatus 110 is described in more detail. As described hereinabove, in the case where the control section 113 decides that the cable 200 is ready for the novel HDMI and besides the sink apparatus 120 is ready for the novel HDMI, it controls the data transmission section 112 to the operation mode of the novel HDMI. Further, in any other case, the control section 113 controls the data transmission section 112 to the operation mode of the current HDMI.

A flow chart of FIG. 11 illustrates a processing procedure of the operation mode control of the control section 113. The control section 113 starts its processing at step ST1 and then advances the processing to a process at step ST2. At this step ST2, the control section 113 decides whether or not the source apparatus 110, that is, the data transmission section 112, is ready for the novel HDMI. Since the control section 113 includes in advance capacity information of the source apparatus 110 (data transmission section 112) in which the control section 113 itself exists, it can carry out the decision readily. It is to be noted that, in the present embodiment, since it is apparent that the source apparatus 110 is ready for the novel HDMI, the control section 113 may omit the decision process at this step ST2.

If it is decided that the source apparatus 110 is ready for the novel HDMI, then the control section 113 decides at step ST3 whether or not the sink apparatus 120, that is, the data reception section 122, is ready for the novel HDMI. Details of this decision are hereinafter described. If it is decided that the sink apparatus 120 is ready for the novel HDMI, then the control section 113 advances the processing to a process at step ST4. At this step ST4, the control section 113 decides whether or not the cable 200 is ready for the novel HDMI. Details of this decision are hereinafter described.

If it is decided that the cable 200 is ready for the novel HDMI, then the control section 113 advances the processing to a step at step ST5. At this step ST5, the control section 113 controls the data transmission section 112 to operate in the operation mode of the novel HDMI. Further, if it is decided at step ST2, step ST3 and step ST4 that the source apparatus 110, sink apparatus 120 and cable 200 are not ready for the novel HDMI, respectively, then the control section 113 advances the processing to a process at step ST6. At this step ST6, the control section 113 controls the data transmission section 112 to operate in the operation mode of the current HDMI.

It is to be noted that, for example, if it is decided at step ST3 that the sink apparatus 120 is ready for the novel HDMI, then the control section 113 transmits a final result of the decision of the operation mode to the sink apparatus 120 through the cable 200. In the transmission of the decision result, the decision result is transmitted, for example, as control information of an info frame or the like before data transmission from the source apparatus 110. In the sink apparatus 120, the data reception section 122 is controlled by the control section 123 based on the decision result of the operation mode from the source apparatus 110 in such a manner that it operates in the operation mode same as that of the data transmission section 112 of the source apparatus 110.

Further, when the control section 113 controls the data transmission section 112 to operate in the operation mode of the novel HDMI at step ST5, it may control such that a UI screen image representing this is displayed on the display section (display), for example, as shown in FIG. 12A. By this UI screen image, the user can readily grasp that the source apparatus 110 and the sink apparatus 120 are connected to each other by the novel HDMI. It is to be noted that the display section (display) on which the UI screen image is displayed is a display section (display) not shown provided in the source apparatus 110 or a display section (display) not shown provided in the sink apparatus 120. This similarly applies to each UI display hereinafter described.

Further, when it is decided at step ST4 that the cable 200 is not ready for the novel HDMI and the processing advances to a process at step ST6, the control section 113 may control such that a UI screen image representing this is displayed on the display section (display), for example, as shown in FIG. 12C. From this UI screen image, the user can recognize readily that, while the source apparatus 110 and the sink apparatus 120 are ready for the novel HDMI, only the cable 200 is not ready for the novel HDMI and can take such a countermeasure as to replace the cable 200 with a novel HDMI cable.

Further, in the processing procedure of the flow chart of FIG. 11, when it is decided at step ST4 that the cable 200 is ready for the novel HDMI, the control section 113 immediately advances the processing to step ST5, at which it controls the data transmission section 112 to operate in the operation mode of the novel HDMI. However, when it is decided at step ST4 that the cable 200 is ready for the novel HDMI, the control section 113 may allow the user to select one of the novel HDMI and the current HDMI (conventional HDMI).

In this instance, the control section 113 controls so that a UI screen image for the same to be displayed on the display section (display), for example, as shown in FIG. 12B. The user would select one of the novel HDMI and the current HDMI based on the UI screen image. FIG. 12B illustrates a state in which the "novel HDMI" is selected. The control section 113 controls the data transmission section 112 to operate the operation mode of the novel HDMI or the current HDMI in response to the selection of the user.

Figure 13:
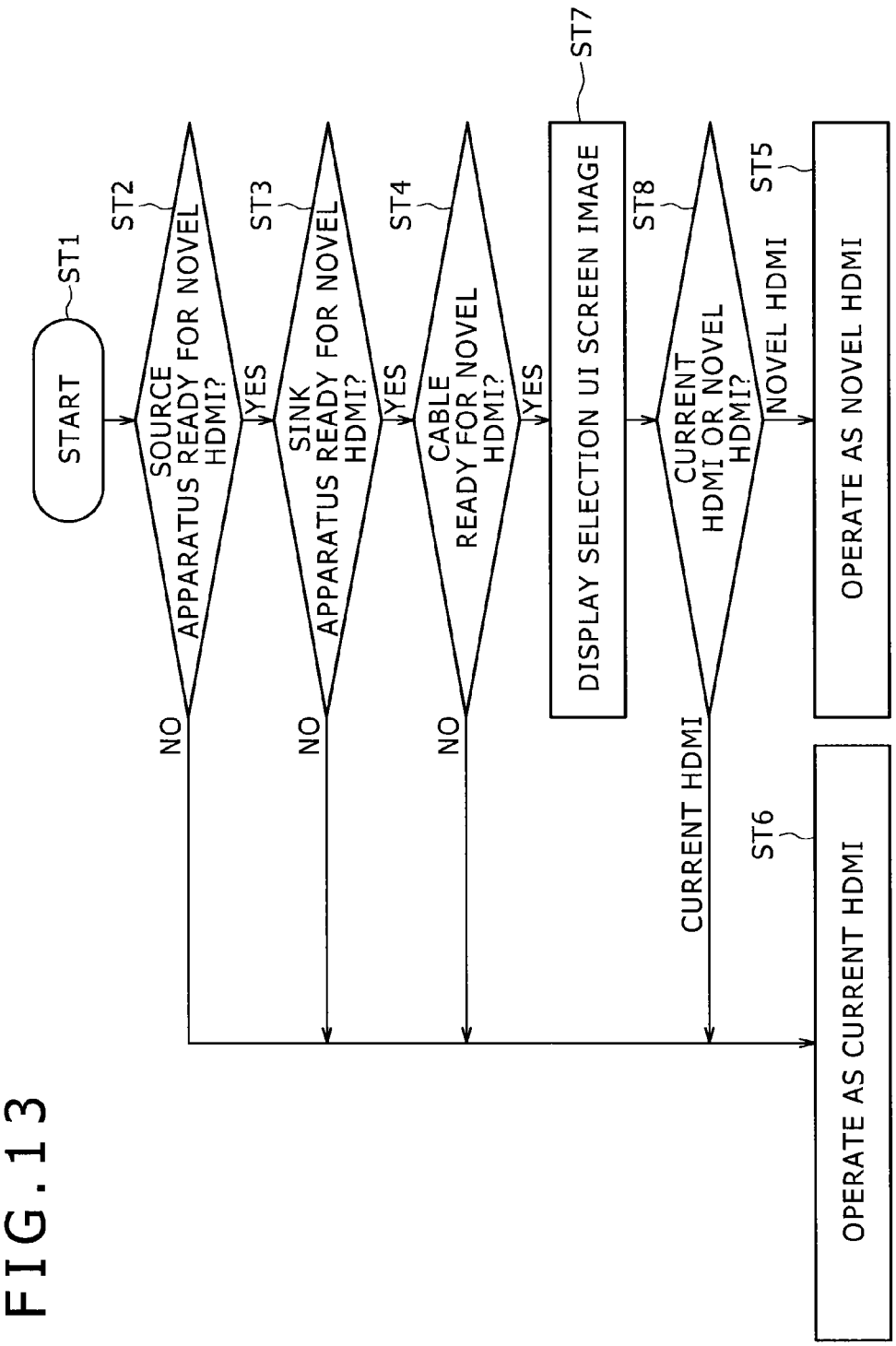
FIG. 13 is a flow chart illustrating another example of the processing procedure for operation mode control of the control section of the source apparatus.

A flow chart of FIG. 13 illustrates a processing procedure of the operation mode control of the control section 113 in this instance. In FIG. 13, like elements to those of FIG. 11 are denoted by like reference characters, and detailed description of the same is omitted. When it is decided at step ST4 that the cable 200 is ready for the novel HDMI, the control section 113 advances its processing to a process at step ST7. At this step ST7, the control section 113 controls the display section (display) to display a UI screen image for selecting one of the novel HDMI and the current HDMI. This display of the UI may be carried out by transmitting the UI as a video signal from the source apparatus 110 through the cable 200 or by issuing an instruction to the sink apparatus 120 to display the UI on itself.

Thereafter, the control section 113 advances the processing to a process at step ST8. At this step ST8, the control section 123 issues a notification of an operation of the user by means of a remote controller through a line such as the CEC line, and consequently, the control section 113 decides which one of the novel HDMI and the current HDMI is selected by the user. When the user selects the novel HDMI, the control section 113 controls the data transmission section 112 to operate in the operation mode of the novel HDMI at step ST5. On the other hand, when the user selects the current HDMI, the control section 113 controls the data transmission section 112 to operate in the operation mode of the current HDMI (conventional HDMI) at step ST6.

[Readiness Decision of the Sink Apparatus for the Novel HDMI]

A method of the decision by the control section 113 regarding whether or not the sink apparatus 120 is ready for the novel HDMI is described. As this decision method, for example, a first decision method and a second decision method described below are available.

[First Decision Method]

The control section 113 carries out, based on EDID read out using the DDC line (SDA line and SCL line) of the cable 200 from the sink apparatus 120, a decision regarding whether or not the sink apparatus 120 is ready for the novel HDMI. The EDID itself has a data structure prescribed on the format. At a predetermined place of the EDID, flag information representative of whether or not the sink apparatus 120 is ready for the novel HDMI (new transmission) is defined newly.

FIG. 14 indicates an example of the flag information defined newly on the EDID. Originally, the EDID is a data structure of the capacity of various sink apparatus 120. FIG. 14 indicates, for simplification of the description, only bytes of the EDID which have a relationship to the present technology, simplifying the illustration to the minimum. In the second bit, flag information "New Rx Sink" of 1 bit indicative of whether or not the sink apparatus 120 is ready for the novel HDMI is defined newly.

When, in the EDID read out from the sink apparatus 120, the flag information "New Rx Sink" of 1 bit described above exists, the control section 113 decides that the sink apparatus 120 is ready for the new HDMI. In other words, in the case where the sink apparatus 120 is ready only for the current HDMI, the flag information "New Rx Sink" of 1 bit described above does not exist in the EDID read out from the sink apparatus 120.

[Second Decision Method]

The control section 113 carries out communication with the sink apparatus 120 trough the cable 200 to carry out a decision regarding whether or not the sink apparatus 120 is ready for the novel HDMI. For example, the control section 113 uses the CEC line to confirm whether or not the sink apparatus 120 is ready for the novel HDMI on the command base.

Further, for example, the control section 113 uses a bidirectional communication path (HEAC function) configured from the utility line and the HPD line to carry out communication with the sink apparatus 120 to confirm whether or not the sink apparatus 120 is ready for the novel HDMI. Further, for example, the control section 113 uses, before transmission becomes valid, an unused line, for example, the utility line or the like, to carry out transfer of some signals to confirm whether or not the sink apparatus 120 is ready for the novel HDMI.

[Readiness Decision of a Cable for the Novel HDMI]

Now, a method of the decision by the control section 113 regarding whether or not the cable 200 is ready for the HDMI is described. The control section 113 decides whether the cable 200 is a cable of the category A (refer to FIGS. 8A and 8B) which is ready for the current HDMI or a cable of the category B (refer to FIG. 9) which is ready for the novel HDMI. In the present embodiment, the control section 113 decides a category from a difference of the plug structure.

Figure 15:
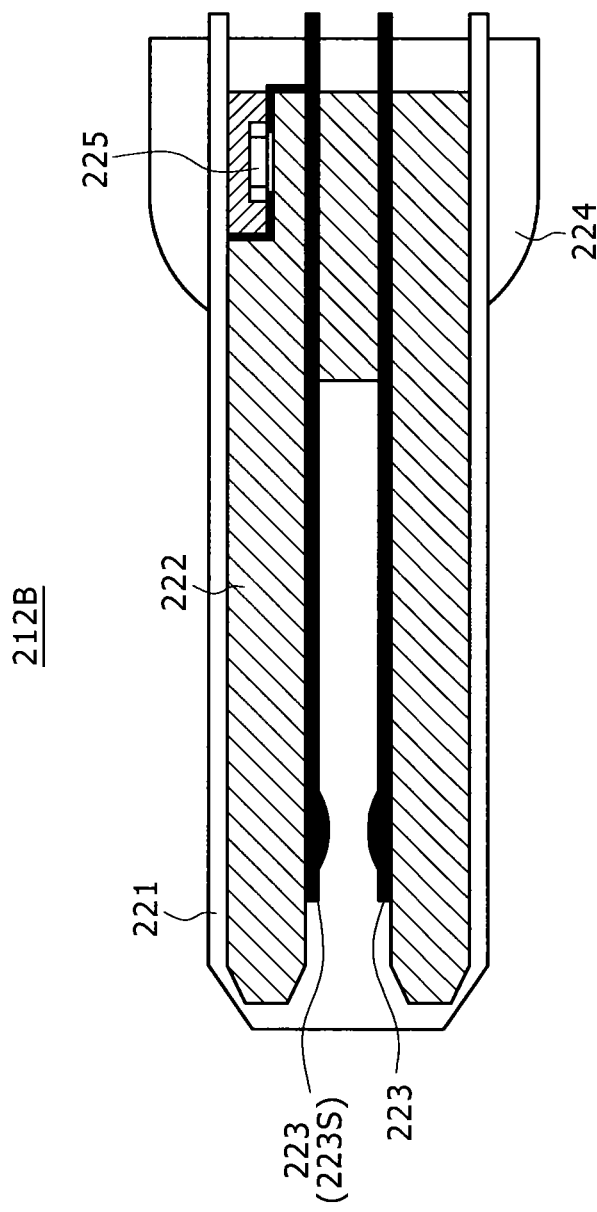
FIG. 15 is a sectional view schematically showing a structure of a plug of a cable of a category B ready for the novel HDMI.

The plug structure of cables of the categories A and B is described. FIG. 15 schematically shows a structure of a plug 212B of a cable of the category B which is ready for the novel HDMI. In this plug 212B, a plurality of pins 223 are disposed on the inner side of a shell (shield shell) 221 made of a metal with an insulator 222 interposed therebetween. It is to be noted that the arrangement state of the elements is fixed and retained by a molded portion 224.

When the plug 212B is connected to the receptacle 111 or 121, the plural pins 223 are connected to corresponding pins of the receptacle 111 or 121. In this plug 212B, a resistor 225 is connected between a predetermined pin 223S from among the plural pins 223 and the shell 221 made of a metal to allow a category decision. This predetermined pin 223S is a pin corresponding to a predetermined pin 111S of the receptacle 111, that is, a pin (refer to FIGS. 6A and 6B) having a pin number 17 allocated to the DDC/CEC Ground/HEAC Shield.

Figure 16:
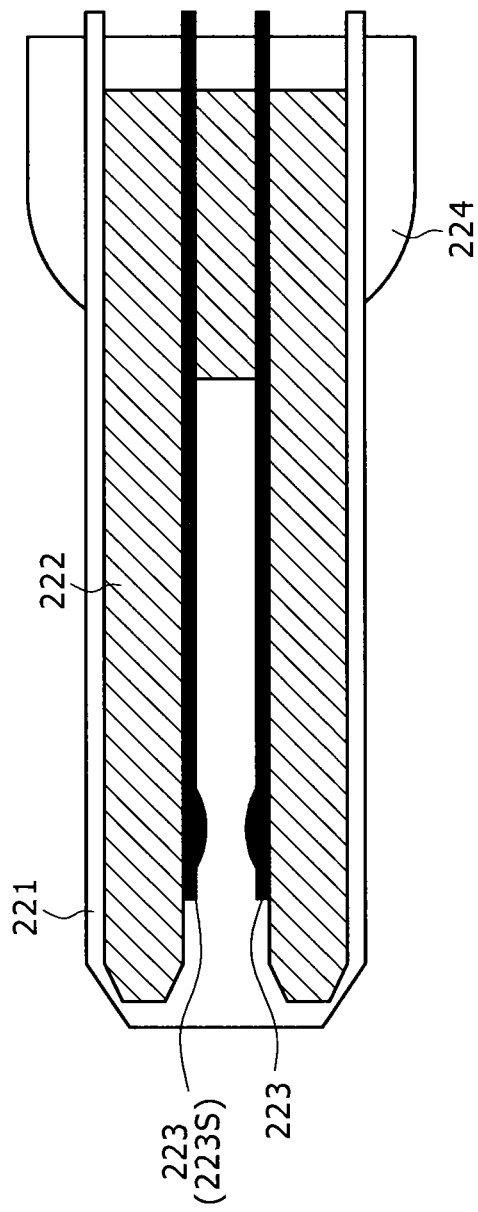
FIG. 16 is a sectional view schematically showing a structure of a plug of a cable of a category A ready for the current HDMI.

FIG. 16 schematically shows a structure of a plug 212A of a cable of the category A which is ready for the current HDMI. In FIG. 16, like elements to those of FIG. 15 are denoted by like reference characters, and detailed description of the same is omitted suitably. Also in this plug 212A, similarly to the plug 212B described above, a plurality of pins 223 are disposed on the inner side of a shell 221 (shield shell) made of a metal with the insulator 222 interposed therebetween. It is to be noted that the arrangement state of the elements is fixed and retained by a molded portion 224. In this plug 212A, different from the plug 212B, the resistor 225 is not connected between the predetermined pin 223S and the shell 221 made of a metal.

The control section 113 applies a predetermined voltage, for example, a power supply voltage, to an object pin (predetermined pin 111S) of the receptacle 111 to decide whether the cable 200 is a current HDMI cable (cable of the category A) or a novel HDMI cable (cable of the category B). In this instance, the control section 113 decides the category of the cable 200 based on the value of current flowing through the object pin.

Figure 17:
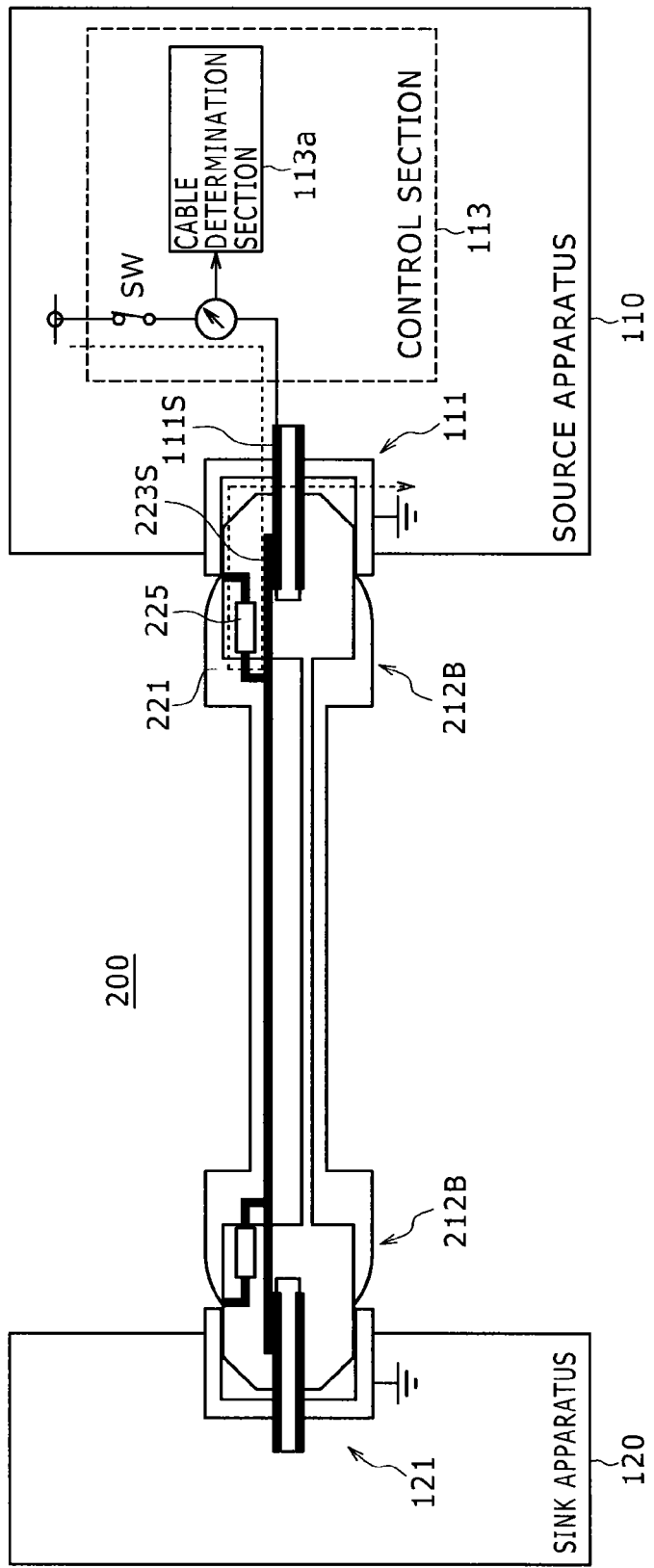
FIG. 17 is a view illustrating a state upon determination in the case where the cable is the novel HDMI cable (cable of the category B)

FIG. 17 illustrates a state upon decision in the case where the cable 200 is a novel HDMI cable (cable of the category B). In the case where the cable 200 is a novel HDMI, the resistor 225 is connected between the object pin (predetermined pin 223S) and the shell 221 as described hereinabove. Therefore, if a switch SW is closed and a power supply voltage, for example, +5 V, is applied to the object pin (predetermined pin 111S) of the receptacle 111, then current flows through the object pin as indicated by a broken line arrow mark. A cable decision section 113a of the control section 113 decides from a result of measurement of the current value at this time that the object pin is conducting by the resistor 225 and obtains a decision result that the cable 200 is a novel HDMI cable (cable of the category B).

Figure 18:
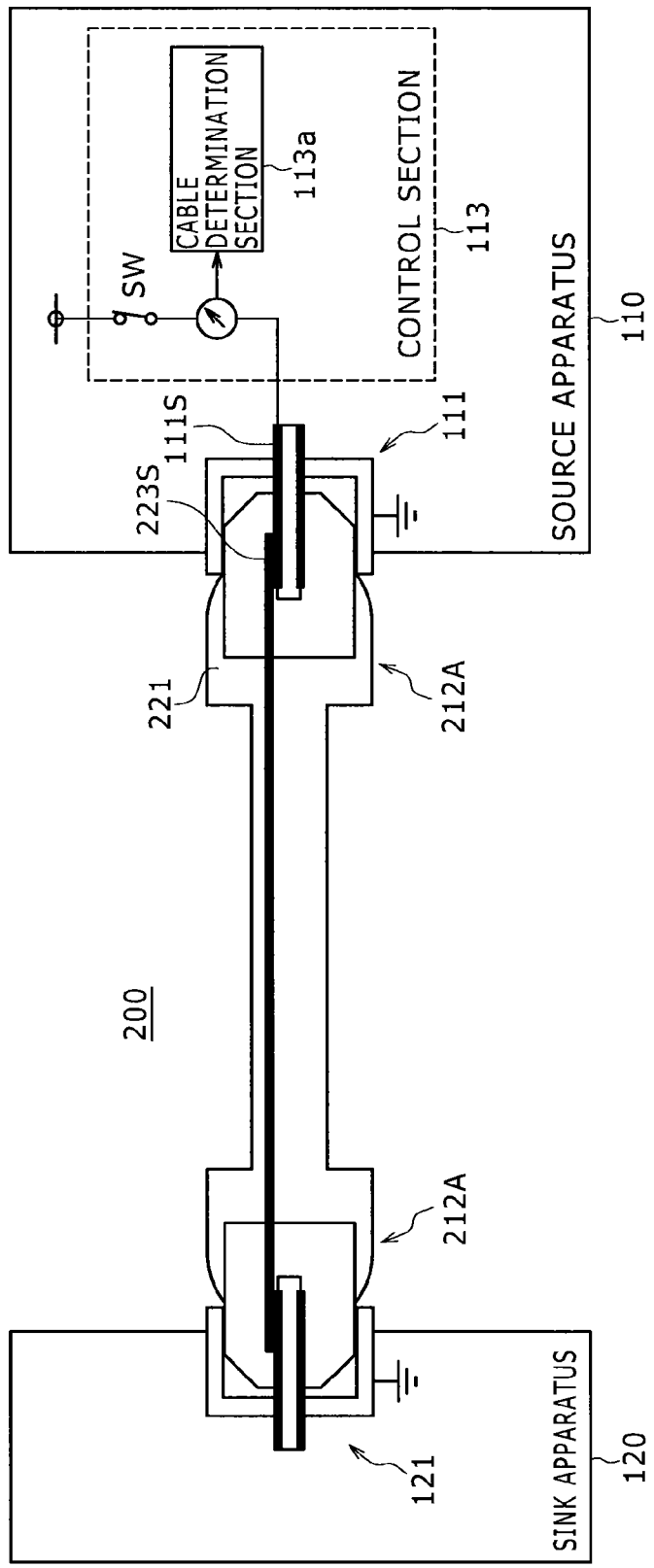
FIG. 18 is a view illustrating a state upon determination in the case where the cable is the current HDMI cable (cable of the category A)

FIG. 18 illustrates a state upon decision in the case where the cable 200 is a current HDMI cable (cable of the category A). In the case where the cable 200 is a current HDMI cable, the resistor 225 is not connected between the object pin (predetermined pin 223S) and the shield shell 221 as described hereinabove. Therefore, even if a switch SW is closed and a power supply voltage, for example, +5 V, is applied to the object pin (predetermined pin 111S) of the receptacle 111, no current flows through the object pin. The cable decision section 113a of the control section 113 decides from the result of the measurement of the current value at this time that the object pin is not conducting, and obtains a decision result that the cable 200 is a current HDMI cable (cable of the category A).

Figure 19:
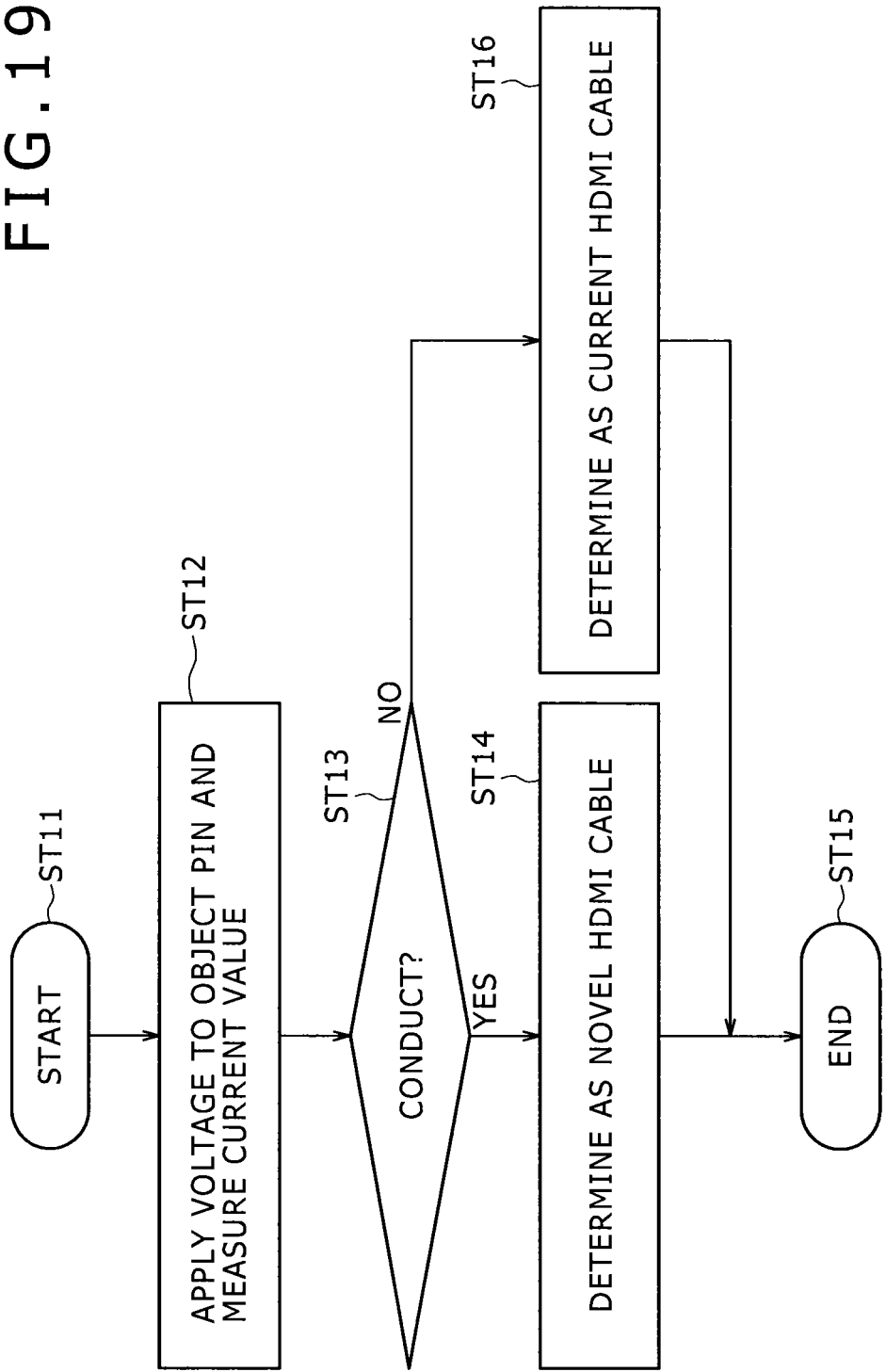
FIG. 19 is a flow chart illustrating an example of a processing procedure for category determination of a cable by the control section of the source apparatus.

A flow chart of FIG. 19 illustrates an example of a processing procedure for the category decision of the cable 200 by the control section 113. The control section 113 starts its processing at step ST11 and then advances the processing to a process at step ST12. At this step ST12, the control section 113 closes the switch SW to apply a voltage to the object pin (predetermined pin 111S) of the receptacle 111 to measure the value of current flowing through this object pin.

It is to be noted that this measurement of the current value is illustrated, for example, in FIGS. 17 and 18 such that the value of flowing current is measured directly. However, also it is possible to dispose a resistor in the current path and measure a voltage drop across the resistor to carry out measurement of the current value indirectly. Further, the measurement of the current value in this instance may be rough measurement. It is sufficient here to carry out a measurement of such a degree that it is determined whether or not the current value is zero.

Then, the control section 113 decides at step ST13 whether or not the cable 200 is conducting. If the current value is not equal to zero, then the control section 113 decides that the cable 200 is conducting. If the cable 200 is conducting, then the control section 113 decides at step ST14 that the cable 200 is a novel HDMI cable (cable of the category B) and thereafter ends the processing at step ST15. On the other hand, when it is decided that the cable 200 is not conducting, the control section 113 decides at step ST16 that the cable 200 is a current HDMI (cable of the category A), and then ends the processing at step ST15.

As described hereinabove, in the AV system 100 shown in FIG. 1, the control section 113 applies a predetermined voltage, for example, a power supply voltage, to the object pin (predetermined pin 111S) of the receptacle 111 to determine the category of the transmission cable 200. In other words, the control section 113 of the source apparatus 110 can determine it by a less expensive and easy method whether the transmission cable 200 is a novel HDMI cable (cable of the category B) or a current HDMI cable (cable of the category A). Then, the control section 113 of the source apparatus 110 controls the operation mode of the data transmission section 112 appropriately based on a decision result of the category of the transmission cable 200.

Accordingly, transmission of a digital signal using the transmission cable 200 between the source apparatus 110 and the sink apparatus 120 can be carried out favorably. The data transmission section 112 of the source apparatus 110 has, in addition to the operation mode of the current HDMI, the operation mode of the novel HDMI. While differential signal channels for transmitting a digital signal of video data or the like are three channels in the current HDMI, they are six channels in the novel HDMI. Therefore, by the use of the novel HDMI, signal transmission of a high data rate can be achieved. Further, when the sink apparatus 120 or the cable 200 is not ready for the novel HDMI, backward compatibility is assured by use of the current HDMI (conventional HDMI).

Figure 20:
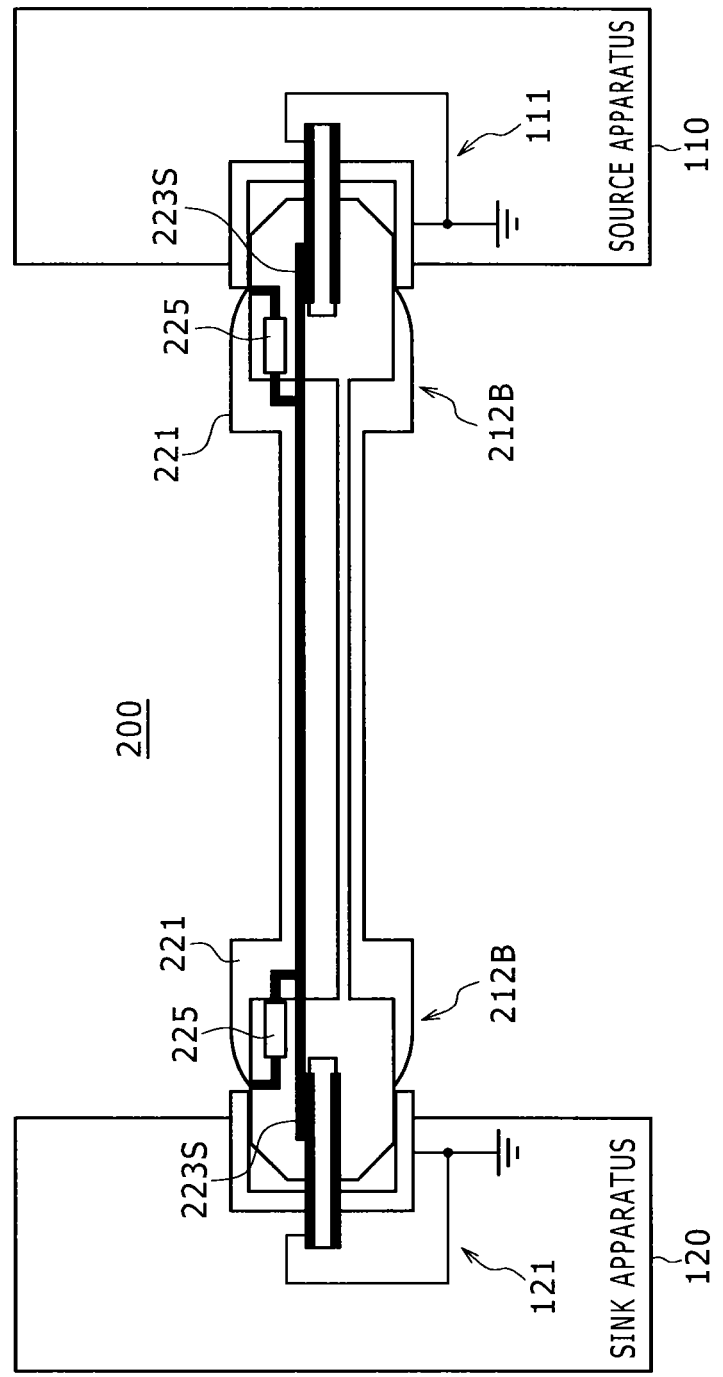
FIG. 20 is a view illustrating a case wherein, where a data transmission section of the source apparatus and a data reception section of the sink apparatus are ready only for the operation mode of the current HDMI, the source apparatus and the sink apparatus are connected to each other by the novel HDMI cable (cable of the category B)

It is to be noted that FIG. 20 illustrates a case in which, in the case where the data transmission section 112 of the source apparatus 110 and the data reception section 122 of the sink apparatus 120 are ready only for the operation mode of the current HDMI, the two apparatus are connected to each other by a novel HDMI cable (cable of the category B). Since the pin 223S to which the resistor 225 is connected originally is a ground pin, this pin 223S is connected to the ground level in the source and sink apparatus. Also the shell (shield shell) 221 made of a metal is connected to the ground level in the source and sink apparatus. Therefore, even if the resistor 225 is connected between the pin 223S and the shell (shield shell) 221 made of a metal, it does not have any influence on data transmission from the source apparatus 110 to the sink apparatus 120 through the transmission cable 200, and operation same as that in the past can be expected.

2. Modifications

It is to be noted that, in the embodiment described hereinabove, a predetermined voltage is applied to the predetermined pin 111S of the receptacle 111 to decide whether the transmission cable 200 is the current HDMI cable (cable of the category A) or the novel HDMI cable (cable of the category B). It is possible to decide various categories of transmission cables by a similar method.

The type of the category may first depend upon the difference of the compensated transmission band. While a transmission cable exhibits, for example, in data transmission of 3 Gbps, signal deterioration to such a degree that data readout is possible at the receiving end, in data transmission of 5 Gbps, readout of data at the receiving end is impossible due to signal deterioration by the transmission cable. This arises, for example, from the resistance value provided by the thickness and the length of used copper wires, a dispersion between differential signals and so forth. In this instance, even if the transmitter and the receiver at the opposite ends of the transmission cable have the transmission capability exceeding 3

Gbps, it is necessary to control so that data transmission is carried out within 3 Gbps taking the capability of the transmission cable into consideration.

The type of the category may depend also upon the difference of the physical structure of a transmission cable. For example, depending upon the difference of the application supported by the transmission cable, the transmission cable may possibly be of a type wherein the number of pairs of differential twist pair copper wires for data transmission may be 3, 4 or 6. Further, as a variation, the type of the category may depend upon presence or absence of high speed control lines. Upon data transmission, an application to be executed must be determined taking not only the transmitter and the receiver at the opposite ends of the transmission cable but also a difference in application supported by the internal structure of the cable into consideration.

Further, in the case where power supply is carried out between apparatus through a transmission cable, the resistance value of the cable makes a cause of various factors such as a voltage drop and heat generation and restricts the capability of the apparatus at the opposite ends the cable. Therefore, it is considered that a category exists for each supplied current value which can be supported by the transmission cable.

Further, some transmission cable has, at a receiving end thereof, a built-in equalizer which improves the signal quality. When an equalizer is used again by the receiver after signal correction is carried out by the equalizer in the transmission cable, there is the possibility that, depending upon the frequency characteristic of the equalizers, the effects of the equalizers may cancel each other. Therefore, in the case where a transmission cable having a built-in equalizer is connected, there may be the necessity to take some countermeasure in the receiver.

FIG. 21 illustrates an example of categories of transmission cables in the case where the compensated transmission band, physical structure, power supply capacity, presence/absence of an equalizer and so forth are taken into consideration. For example, the transmission cable of the "category 1" is a transmission cable wherein data transmission of 3 Gbps is compensated, which has a 6-lane structure (the number of differential twisted pair copper lines for data transmission is 6), which has a power supply capacity of 0.5 A and which does not have a built-in equalizer.

Meanwhile, for example, the transmission cable of the "category 2" is a transmission cable wherein data transmission of 3 Gbps is compensated, which has a 3-lane structure (the number of differential twist pair copper lines for data transmission is 3), which has a power supply capacity of 2 A and which does not have a built-in equalizer. Further, for example, the transmission cable of the "category 3" is a transmission cable wherein data transmission of 3 Gbps is compensated, which has a 6-lane structure (the number of differential twisted pair copper lines for data transmission is 6), which has a power supply capacity of 0.5 A and which has a built-in equalizer. Furthermore, for example, the transmission cable of the "category 4" is a transmission cable wherein data transmission of 6 Gbps is compensated, which has a 6-lane structure (the number of differential twisted pair copper lines for data transmission is 6), which has a power supply capacity of 2 A and which has a built-in equalizer.

For example, in the case of the transmission cable of the "category 1," a resistor of 50 Ω is connected between a predetermined pin (pin to which a voltage is applied upon decision) and the shield shell of the plug. In this instance, for example, when a power supply voltage of 5 V is applied, current of 100 mA flows. Further, for example, in the case of the transmission cable of the "category 2," a resistor of 100 Ω is connected between a predetermined pin (pin to which a voltage is applied upon decision) and the shield shell of the plug. In this instance, for example, when a power supply voltage of 5 V is applied, current of 50 mA flows.

Further, for example, in the case of the transmission cable of the "category 3," a resistor of 500Ω is connected between a predetermined pin (pin to which a voltage is applied upon decision) and the shield shell of the plug. In this instance, for example, when a power supply voltage of 5 V is applied, current of 10 mA flows. Further, for example, in the case of the transmission cable of the "category 4," a resistor of 5 kΩ is connected between a predetermined pin (pin to which a voltage is applied upon decision) and the shield shell of the plug. In this instance, for example, when a power supply voltage of 5 V is applied, current of 1 mA flows.

In this manner, in the case of the transmission cables from the "category 1" to the "category 4," the current value flowing upon voltage application differs thereamong. Therefore, by measuring the current value, a decision of the category can be carried out. It is to be noted that the "category 1" to the "category 4" of transmission cables illustrated in FIG. 21 are an example to the end, and transmission cables of various other categories are possible. Also in this instance, the category can be determined readily from the current value upon voltage application by making different the value of the resistor to be connected between a predetermined pin (pin to which a voltage is applied upon determination) and the shield shell a of the plug among the transmission cables.

It is to be noted that, in the embodiment described above, whether the transmission cable is the novel HDMI cable (cable of the category B) is decided depending upon whether or not current flows when a predetermined voltage is applied to the predetermined pin 1115 of the receptacle 111. However, for example, as the novel HDMI cable (cable of the category B), also transmission cables 200 of a plurality of categories among which the compensated transmission band or the like differs may be applicable.

In this instance, for each category, the value of the resistor 225 connected between the predetermined pin 223S and the shell 221 of the plug is changed. Consequently, the control section 113 of the source apparatus 110 can decide that the cable 200 is a novel HDMI cable (cable of the category B) when current flows upon voltage transmission and can decide a finer category from the current value.

A flow chart of FIG. 22 illustrates an example of a processing procedure for the category decision of the cable 200 by the control section 113. The control section 113 starts its processing at step ST21 and then advances the processing to a process at step ST22. At this step ST22, the control section 113 closes the switch SW (refer to FIGS. 17 and 18) to apply a voltage to the object pin (predetermined pin 1115) of the receptacle 111 and measures the value of current flowing through this object pin.

Then, the control section 113 decides at step ST23 whether or not the cable 200 is conducting. If the current value is not equal to zero, then the control section 113 decides that the cable 200 is conducting. If the cable 200 is conducting, then the control section 113 decides at step ST24 that the cable 200 is a novel HDMI cable (cable of the category B) and further decides a finer category from the current value. Thereafter, the processing is ended at step ST25. On the other hand, when it is decided that the cable 200 is not conducting, the control section 113 decides at step ST26 that the cable 200 is a current HDMI cable (cable of the category A) and then ends the processing at step ST25.

Further, in the embodiment described above, an example wherein the transmission cable 200 is a HDMI cable is indicated, and an example wherein a single pin is made an object of connection or non-connection of a resistor is indicated (refer to FIGS. 15 and 16). However, for example, a quite novel interface cable may be configured such that a plurality of, for example, approximately four, pins are provided as pins for indicating the capability of the transmission cable. Since each of the pins has two states of connection and non-connection to a line of the ground level (a pin or a shield shell), information of 4 bits (16 states) is provided, and 16 types of categories can be indicated.

Figure 23A:
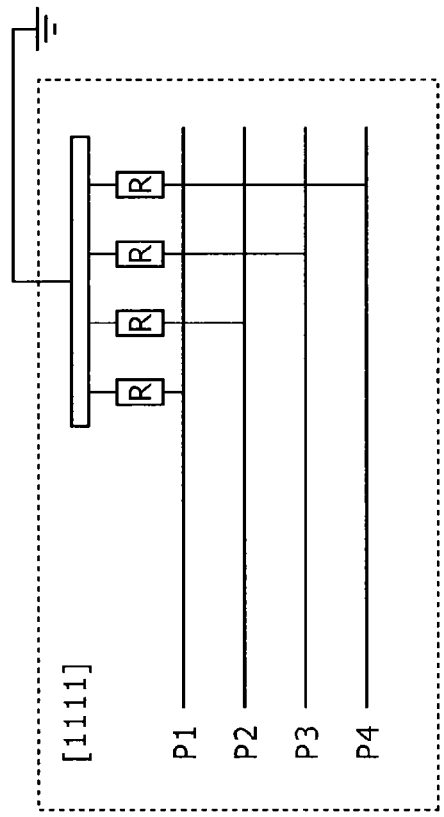
FIGS. 23A and 23B are views illustrating that a plurality of pins representative of the capacity of a transmission cable are provided.
Figure 23B:
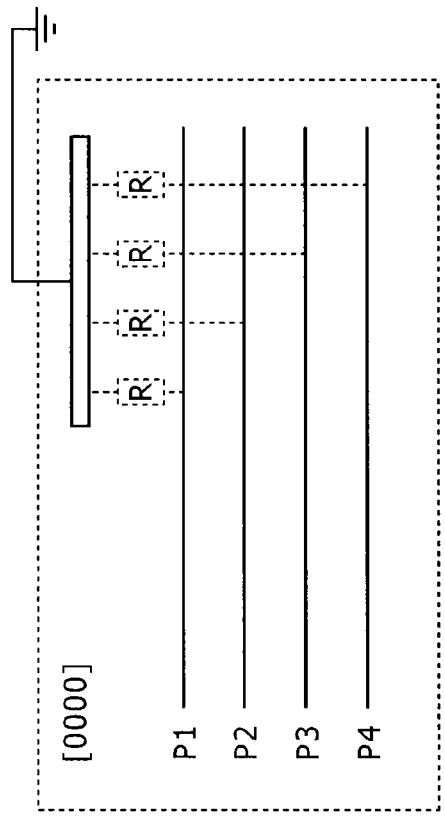

In this instance, a voltage is successively applied to the pins, and information of each bit is obtained depending upon whether or not current flows. For example, FIG. 23A shows an example wherein all of the four pins P1 to P4 are connected to a line of the ground level each through a resistor R, and 4-bit information of "1111" is obtained. Meanwhile, for example, FIG. 23B shows an example wherein none of the four pins P1 to P4 is connected to the line of the ground level, and 4-bit information of "0000" is obtained. In this instance, only a digital decision of whether or not current flows is required, and it is facilitated to decide three or more kinds of categories of transmission cables.

Figure 24A:
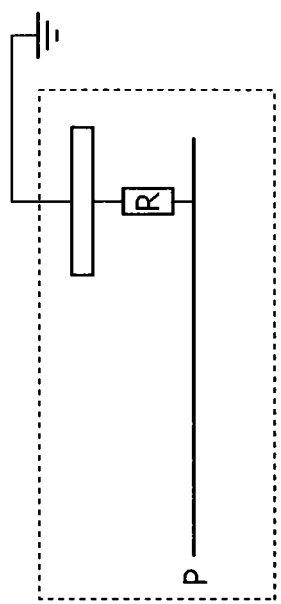
FIGS. 24A and 24B are views illustrating a case wherein it is made possible to select that a resistor is interposed between a pin and the ground level and that a resistor is interposed between a pin and a power supply level.
Figure 24B:
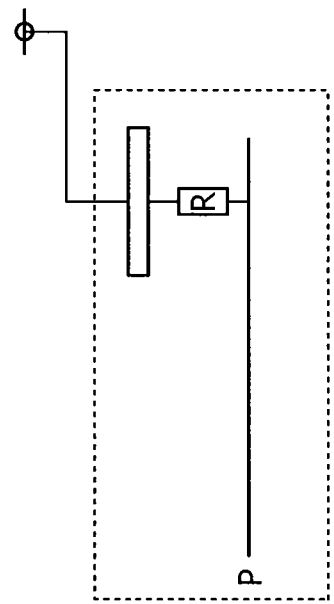

Further, it is possible to provide information of two times of states by selection between insertion of a resistor R between a pin P and the ground level as shown in FIG. 24A and insertion of a resistor R between a pin P and a power supply level as shown in FIG. 24B. Thereupon, after a decision of conduction, for example, with the ground level, a decision of conduction with the power supply level is carried out. For example, when a decision of conduction with the ground level is to be carried out, the power supply voltage is applied to the pin P to measure the current value. On the other hand, when a decision of conduction with the power supply level is to be carried out, the pin P is grounded to carry out measurement of the current value.

Further, in the embodiment described hereinabove, in the transmission cable 200 as a novel HDMI cable, the resistor 225 is connected between the predetermined pin 223S and the shield shell 221 of the plug 212B. However, in the case where the decision regarding whether or not the cable 200 is a novel HDMI cable is carried out, that is, where a finer category decision is not carried out and the current value does not matter, a configuration may be adopted that the predetermined pin 223S and the shield shell 221 of the plug 212B are short-circuited to each other.

Further, in the embodiment described hereinabove, in the transmission cable 200 as a novel HDMI cable, the resistor 225 is connected between the predetermined pin 223S and the shield shell 221 of the plug 212B. Therefore, for example, by carrying out such management as to mount a resistor 255 upon a certificate test, it is possible to make it essential to take an authentication test and also it becomes possible to prevent illegal crude cables from being placed on the market.

Further, also it is possible for the present technology to take such configurations as described below.

(1) An electronic apparatus, including:
a receptacle having a plurality of pins for connecting a plug of a transmission cable; and
a transmission cable determination section adapted to apply a predetermined voltage to a predetermined one of the pins of the receptacle to determine a category of the transmission cable.

(2) The electronic apparatus according to (1) above, wherein the transmission cable determination section determines the category of the transmission cable based on whether or not current flows through the predetermined pin when the predetermined voltage is applied to the predetermined pin of the receptacle.

(3) The electronic apparatus according to (1) or (2) above, wherein the transmission cable determination section determines the category of the transmission cable based on the magnitude of current flowing through the predetermined pin when the predetermined voltage is applied to the predetermined pin of the receptacle.

(4) The electronic apparatus according to any of (1) to (3) above, wherein the transmission cable determination section determines the category of the transmission cable by successively applying the predetermined voltage to a plurality of pins as the predetermined pin of the receptacle.

(5) The electronic apparatus according to any of (1) to (4) above, wherein the transmission cable transmits a digital signal in the form of differential signals, and
the transmission cable determination section
applies the predetermined voltage to the predetermined pin of the receptacle to determine which one of a first category and a second category which use different numbers of channels of differential signals from each other the category of the transmission cable is.

(6) The electronic apparatus according to any of (1) to (5) above, further including:
a digital signal transmission section adapted to transmit a digital signal to an external apparatus through the transmission cable; and
an operation controlling section adapted to control operation of the digital signal transmission section based on a result of the determination of the transmission cable determination section.

(7) The electronic apparatus according to (6) above, wherein the digital signal transmission section
has a first operation mode and a second operation mode in which the digital signal transmission section transmits a digital signal in the form of differential signals to the external apparatus through a transmission line such that the number of channels of the differential signals in the first operation mode is a first number and the number of channels of the differential signals in the second operation mode is a second number which is greater than the first number, and
the transmission cable determination section
applies the predetermined voltage to the predetermined pin of the receptacle to determine whether the category of the transmission cable is a first category which is ready for the first operation mode and a second category which is ready for the second operation mode.

(8) The electronic apparatus according to any one of (1) to (7) above, wherein
the category of the transmission cable indicates a difference in physical structure.

(9) The electronic apparatus according to any one of (1) to (8) above, wherein
the category of the transmission cable indicates a difference in compensated transmission band.

(10) The electronic apparatus according to any one of (1) to (9) above, wherein
the category of the transmission cable indicates a difference in value of current which can be supplied through the transmission cable.

(11) The electronic apparatus according to any one of (1) to (10) above, wherein
the category of the transmission cable indicates a difference in presence/absence of an equalizer.

(12) A category determination method for a transmission cable, wherein
a predetermined voltage is applied to a predetermined pin of a receptacle, which has a plurality of pins for connecting a plug of a transmission cable, to determine the category of the transmission cable.

(13) An electronic apparatus, including:
a digital signal transmission section having a first operation mode and a second operation mode in which the digital signal transmission section transmits a digital signal in the form of differential signals to the external apparatus through a transmission line such that the number of channels of the differential signals in the first operation mode is a first number and the number of channels of the differential signals in the second operation mode is a second number which is greater than the first number;
a receptacle having a plurality of pins for connecting a plug of the transmission cable;
a transmission cable determination section adapted to apply a predetermined voltage to a predetermined one of the pins of the receptacle to determine whether the category of the transmission cable is a first category which is ready for the first operation mode and a second category which is ready for the second operation mode; and
an operation controlling section adapted to control operation of the digital signal transmission section based on a result of the determination of the transmission cable determination section.

(14) A transmission cable, including:
a plug having a plurality of pins disposed on the inner side of a shield shell with an insulating member interposed therebetween for connecting to a receptacle of an electronic apparatus;
a resistor being connected between a predetermined one of the pins and the shield shell of the plug.

(15) The transmission cable according to (14) above, wherein
the resistance value of the resistor is a value corresponding to a category of the transmission cable.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic apparatus, comprising:
a receptacle having a plurality of pins for connecting a plug of a transmission cable; and
transmission cable determination circuitry configured to apply a predetermined voltage to a predetermined plurality of pins of the plurality of pins of said receptacle and to determine a category of the transmission cable,
wherein the transmission cable determination circuitry determines the category of the transmission cable based on a detection performed by the transmission cable determination circuitry, the detection performed by the transmission cable determination circuitry being performed after the application of the predetermined voltage to the predetermined plurality of pins of the plurality of pins of said receptacle, and
wherein the transmission cable determination circuitry applies the predetermined voltage to the predetermined plurality of pins of the plurality of pins of said receptacle in order to determine the category of the transmission cable.

2. The electronic apparatus according to claim 1, wherein said transmission cable determination circuitry determines the category of the transmission cable based on whether or not current flows through the predetermined pin when the predetermined voltage is applied to the predetermined pin of said receptacle.

3. The electronic apparatus according to claim 1, wherein said transmission cable determination circuitry determines the category of the transmission cable based on the magnitude of current flowing through the predetermined pin when the predetermined voltage is applied to the predetermined pin of said receptacle.

4. The electronic apparatus according to claim 1, wherein said transmission cable determination circuitry determines the category of the transmission cable by successively applying the predetermined voltage to the predetermined plurality of pins of said receptacle.

5. The electronic apparatus according to claim 1, wherein the transmission cable transmits a digital signal in the form of differential signals, and
said transmission cable determination circuitry applies the predetermined voltage to the predetermined pin of said receptacle to determine which one of a first category and a second category, which use different numbers of channels of differential signals from each other, is the category of the transmission cable.

6. The electronic apparatus according to claim 1, further comprising:
digital signal transmission circuitry configured to transmit a digital signal to an external apparatus through the transmission cable; and
an operation controlling circuitry configured to control operation of said digital signal transmission circuitry based on a result of the determination of said transmission cable determination circuitry.

7. The electronic apparatus according to claim 6, wherein said digital signal transmission circuitry has a first operation mode and a second operation mode in which said digital signal transmission circuitry transmits a digital signal in the form of differential signals to the external apparatus through a transmission line such that the number of channels of the differential signals in the first operation mode is a first number and the number of channels of the differential signals in the second operation mode is a second number which is greater than the first number, and
said transmission cable determination circuitry applies the predetermined voltage to the predetermined pin of said receptacle to determine whether the category of the transmission cable is a first category which is ready for the first operation mode and a second category which is ready for the second operation mode.

8. The electronic apparatus according to claim 1, wherein the category of the transmission cable indicates a difference in physical structure.

9. The electronic apparatus according to claim 1, wherein the category of the transmission cable indicates a difference in compensated transmission band.

10. The electronic apparatus according to claim 1, wherein the category of the transmission cable indicates a difference in value of current which can be supplied through the transmission cable.

11. The electronic apparatus according to claim 1, wherein the category of the transmission cable indicates a difference in presence/absence of an equalizer.

12. A category determination method for a transmission cable, comprising:
applying, by transmission cable determination circuitry, a predetermined voltage to a predetermined plurality of pins of a receptacle, which has a plurality of pins for connecting a plug of a transmission cable;

determining, by the transmission cable determination circuitry, the category of the transmission cable, wherein the transmission cable determination circuitry determines the category of the transmission cable based on a detection performed by the transmission cable determination circuitry, the detection performed by the transmission cable determination circuitry being performed after the application of the predetermined voltage to the predetermined plurality of pins of said receptacle, and wherein the transmission cable determination circuitry applies the predetermined voltage to the predetermined plurality of pins of said receptacle in order to determine the category of the transmission cable.

13. An electronic apparatus, comprising:

digital signal transmission circuitry having a first operation mode and a second operation mode in which said digital signal transmission circuitry transmits a digital signal in the form of differential signals to the external apparatus through a transmission line such that the number of channels of the differential signals in the first operation mode is a first number and the number of channels of the differential signals in the second operation mode is a second number which is greater than the first number;

a receptacle having a plurality of pins for connecting a plug of the transmission cable;

transmission cable determination circuitry configured to apply a predetermined voltage to a predetermined one of the pins of said receptacle to determine whether the category of the transmission cable is a first category which is ready for the first operation mode and a second category which is ready for the second operation mode; and operation controlling circuitry configured to control operation of said digital signal transmission circuitry based on a result of the determination of said transmission cable determination circuitry.

* * * * *